US007888290B2

(12) United States Patent
Gulian et al.

(10) Patent No.: US 7,888,290 B2
(45) Date of Patent: Feb. 15, 2011

(54) MATERIAL EXHIBITING SUPERCONDUCTIVITY CHARACTERISTICS AND METHOD OF MANUFACTURE THEREOF

(76) Inventors: Armen Gulian, Naval Research Laboratory, 4555 Overlook Ave. SW. Code 7655, Washington, DC (US) 20375; Kent S Wood, Naval Research Laboratory, 4555 Overlook Ave. SW. Code 7655, Washington, DC (US) 20375; Deborah Van Vechten, Naval Research Laboratory, 4555 Overlook Ave. SW. Code 7650, Washington, DC (US) 20375; Vahan R Nikoghosyan, Gitavan IFI 12, Apt. 1, Ashtarak-2 (AM) 0203

( * ) Notice: Subject to any disclaimer, the term of this patent is extended or adjusted under 35 U.S.C. 154(b) by 1162 days.

(21) Appl. No.: 11/530,973

(22) Filed: Sep. 12, 2006

(65) Prior Publication Data

US 2010/0248967 A1 Sep. 30, 2010

Related U.S. Application Data

(60) Provisional application No. 60/718,242, filed on Sep. 12, 2005.

(51) Int. Cl.
*H01L 39/24* (2006.01)
(52) U.S. Cl. .................. 505/237; 505/325; 505/410; 505/411; 505/412
(58) Field of Classification Search .............. 505/410, 505/411, 412, 237, 325; 938/2
See application file for complete search history.

(56) References Cited

U.S. PATENT DOCUMENTS

| 5,912,472 | A | * | 6/1999 | Voigtlaender et al. | 257/31 |
| 6,060,735 | A | * | 5/2000 | Izuha et al. | 257/295 |
| 2001/0050355 | A1 | * | 12/2001 | Ikeda et al. | 252/500 |
| 2003/0132991 | A1 | * | 7/2003 | Higuchi et al. | 347/70 |

OTHER PUBLICATIONS

Gulian, et al. "Evidence for High-Temperature Superconductivity in Doped Laser-Processed Sr-Ru-O." Downloaded from arXiv.org. Submitted Sep. 13, 2005.*

(Continued)

*Primary Examiner*—Jessica L Ward
*Assistant Examiner*—Paul A Wartalowicz
(74) *Attorney, Agent, or Firm*—Amy L. Ressing; Stephen T. Hunnius

(57) ABSTRACT

The invention herein is directed towards a material exhibiting superconductivity characteristics which includes a laser processed region of a metal oxide crystal. The material has a transition temperature greater than a transition temperature of the metal oxide crystal, preferably greater than 140K. The transition temperature of the material may be considered greater than the transition temperature of the metal oxide crystal if the material has a transition temperature and the metal oxide crystal has no transition temperature. The present invention is also directed to a material which includes a laser processed strontium ruthenate crystal wherein the material has a greater oxygen content than the starting strontium ruthenate crystal. The present invention is also directed towards a method for manufacturing a material exhibiting superconductivity characteristics that includes providing a metal oxide crystal and laser ablating the metal oxide crystal and a material made by this process.

6 Claims, 21 Drawing Sheets

OTHER PUBLICATIONS

Wood, et al. "Triplet Superconductors: Exploitable Basis for Scaleable Quantum Computing." Realizing Controllable Quantum States: Mesoscopic Superconductivity and Spintronics: In the Light of Quantum Computation, $3^{rd}$, Atsugi, Japan, Mar. 1-4, 2004, pp. 343-348.*

R. C. Lobo, F. J. Berry, and C. Greaves, "The synthesis and structural characterization of Sr2CuO4-x, x~0.1", J. Solid State Chem., vol. 88, pp. 513-519 (1990).

M.C. Polo, J. Cirfe et al., "Pulsed laser deposition of diamond from graphite targets," Appl. Phys. Lett., vol. 67, No. 4, p. 435 (Jul. 24, 1995).

P.S. Banks, B.C. Stuan et al., "Short Pulse laser Production of Diamond Thin Films," UCRL-ID-130327 (Mar. 20, 1998).

O. Chmaissem, J. D. Jorgensen, H. Shaked, S. Ikeda and Y. Maeno, "Thermal expansion and compressibility of Sr2RuO4," Phys. Rev. B, vol. 57, pp. 5067-5070 (1998).

Adam Mechler et al., "Excimer laser irradiation induced formation of diamond-like carbon layer on graphite," Applied Surface Science, vol. 138-139, pp. 174-178 (1999).

M.D. Shink, P.A. Motian, "Ultra-short pulsed laser ablation of highly oriented pyrolytic graphite," Carbon, vol. 39, pp. 1183-1193 (2001).

S. Karimoto, H. Yamamoto, H. Sato, A. Tsukada, and M. Naito, "Tc versus lattice constants in MBE-grown M2CuO4 (M=La, Sr, Ba)," J. Low Temp. Phys., vol. 131, pp. 619-623 (2003).

A. P. Mackenzie, Y. Maeno, "The superconductivity of Sr2RuO4 and the physics of spin-triplet pairing," Rev. Mod. Phys., vol. 75, pp. 657-712 (2003).

Yoichi Ando, et al, "Electronic Phase Diagram of High-Tc Cuprate Superconductors," Physical Review Letters, PRL 93, 267001 (Dec. 31, 2004).

* cited by examiner

US 7,888,290 B2

MATERIAL EXHIBITING SUPERCONDUCTIVITY CHARACTERISTICS AND METHOD OF MANUFACTURE THEREOF

CROSS-REFERENCE TO RELATED APPLICATIONS

This application is a non-provisional application of U.S. Provisional Application No. 60/718,242, filed Sep. 12, 2005, which is incorporated herein by reference in its entirety.

FIELD OF THE INVENTION

The present invention is generally directed to materials exhibiting superconductivity characteristics and/or additional oxygen content and methods of manufacture therefore.

BACKGROUND OF THE INVENTION

Laser ablation is one of the non-traditional methods of materials processing that may substantially alter the physical properties of samples. In addition to removing atoms from the surface, it may leave behind a recrystallized surface layer of altered composition and properties.

For example, lasers have been used to change the crystalline structure of graphite to form diamonds. M. C. Polo, J. Cirfe et al., "Pulsed laser deposition of diamond from graphite targets," *Appl. Phys. Lett.*, Vol. 67, No. 4, p. 435 (24 Jul. 1995). P. S. Banks, B. C. Stuan et al., "Short Pulse laser Production of Diamond Thin Films," UCRL-ID-130327 (Mar. 20, 1998). M. D. Shink, P. A. Motian, "Ultra-short pulsed laser ablation of highly oriented pyrolytic graphite," *Carbon*, Vol. 39, pp. 1183-1193 (2001). Adam Mechler et al., "Excimer laser irradiation induced formation of diamond-like carbon layer on graphite," *Applied Surface Science*, Vol. 138-139, pp. 174-178 (1999).

Oxygen content is known to affect layered cuprate superconductors. For example, for $YBa_2Cu_3O_{6+\delta}$, relatively small variations of oxygen can shift this material's properties from a dielectric to a superconductor. Yoichi Ando, et al, "Electronic Phase Diagram of High-$T_c$, Cuprate Superconductors," *Physical Review Letters*, PRL 93, 267001 (Dec. 31, 2004). Another, isostructural example, is $Sr_2CuO_{4-\delta}$, which is known as a semiconductor at $\delta=0.1$. See R. C. Lobo, F. J. Berry, and C. Greaves, "The synthesis and structural characterization of $Sr_2CuO_{4-x, x\sim 0.1}$", *J. Solid State Chem.*, Vol. 88, pp. 513-519 (1990). $Sr_2CuO_{4-\delta}$ exhibits superconductivity at 50K when oxygen is enhanced. See S. Karimoto, H. Yamamoto, H. Sato, A. Tsukada, and M. Naito, "$T_c$ versus lattice constants in MBE-grown $M_2CuO_4$ (M=La, Sr, Ba)," *J. Low Temp. Phys.*, Vol. 131, pp. 619-623 (2003). The ability of copper to take on different valences plays a role in allowing these modified species to exist. Similarly, ruthenium is known to have valences higher than +4, while strontium can have only a valence of +2. At the same time compounds are known, for example, $RuO_4$, where the valence of ruthenium is +8, and intermediate valences are also possible. Previous attempts to enhance the oxygen content of $Sr_2RuO_4$ appear to be largely unsuccessful. A. P. Mackenzie, Y. Maeno, "The superconductivity of $Sr_2RuO_4$ and the physics of spin-triplet pairing," *Rev. Mod. Phys.*, Vol. 75, pp. 657-712 (2003). Perhaps, this was because equilibrium thermodynamic approaches were used in those attempts.

BRIEF SUMMARY OF THE INVENTION

The present invention is generally directed to materials exhibiting superconductivity characteristics and methods of manufacture therefore.

In particular, the present application is generally directed towards a material exhibiting superconductivity characteristics which includes a laser processed region of a metal oxide crystal. The material has a transition temperature that is greater than a transition temperature of the metal oxide crystal. The transition temperature of the material is also considered greater than the transition temperature of the metal oxide crystal if the material has a transition temperature and the metal oxide crystal has no transition temperature. In a preferred embodiment, the transition temperature of the material is greater than 140K. Another aspect of the present invention includes a material exhibiting superconductivity characteristics in which the laser processed region of a strontium ruthenate crystal constitutes a material having greater oxygen content than the strontium ruthenate crystal.

Another aspect of the present invention is directed towards a method for manufacturing a material exhibiting superconductivity characteristics that includes providing a metal oxide crystal, preferably a strontium ruthenate crystal, and laser ablating the metal oxide crystal. Another aspect of the present invention is a material exhibiting superconductivity characteristics made by a process including providing a metal oxide crystal and laser ablating the metal oxide crystal.

The foregoing and other features and advantages of the present invention will be apparent from the following, more particular description of a preferred embodiment of the invention, as illustrated in the accompanying drawings.

DETAILED DESCRIPTION OF THE INVENTION

Figure 1:
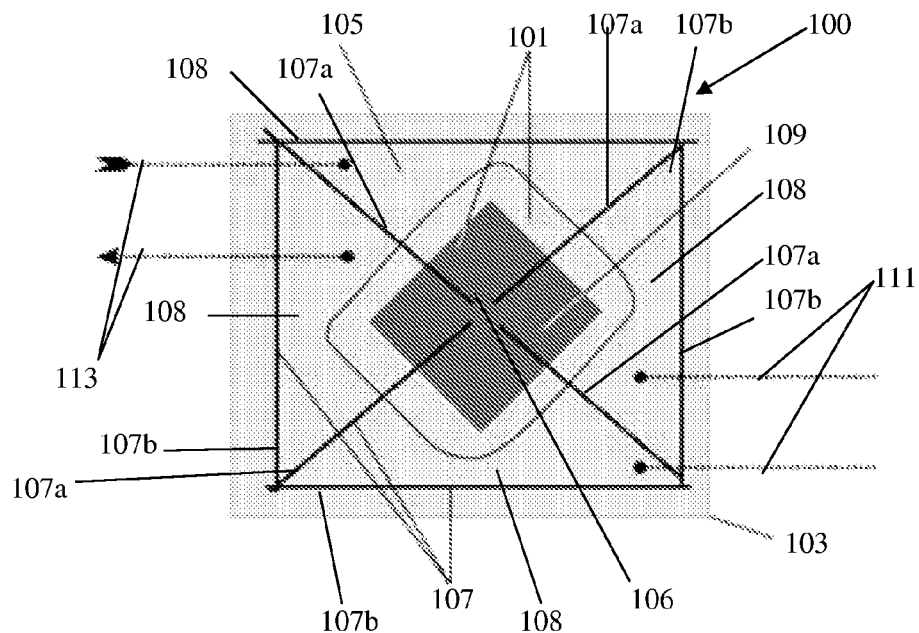
FIG. 1 is a schematic figure of a sample including the superconductive material of the present invention and the general method for manufacturing the superconductive material.

Prior to the present invention, the highest transition temperature of a superconductive material was about 135K-140k. However, starting from a metal oxide crystal, such as a single $Sr_2RuO_4$ crystal, and using laser processing, a material is produced having enhanced oxygen content and demonstrating enhanced superconductivity behavior, for example exhibiting a resistivity transition at a very high temperature, e.g., above about 140K. In particular, the laser ablation produces a material of the present invention which has a transition temperature that is higher than the transition temperature for the starting metal oxide crystal, which includes the presence of a transition temperature where the starting metal oxide crystal has no transition temperature. In one embodiment of the present invention, for example, laser ablation was used to highly perfect crystals of the triplet superconductor $Sr_2RuO_4$. The highest transition temperature of a strontium ruthenate crystal is about 2.5K. The ablated region of the strontium ruthenate crystal forms a material having high temperature superconductor characteristics with a transition above 140K, and even as high above about 200-250K. As such, the material of the present invention has a transition temperature which is greater than the transition temperature of the starting metal oxide, for example strontium ruthenate. The ablated region of the strontium ruthenate crystal is also a material having increased oxygen content over the $Sr_2RuO_4$ crystals. Superconductivity characteristics are demonstrated based upon resistivity, SQUID measurements, magneto-optic (MO) imagery and findings of a Meissner effect.

Multiple resistance measurements were carried on the laser ablated material, and the results are consistent with a superconducting transition in that the resistance falls to zero at relatively high temperatures. Also, magnetization measurements reveal the existence of a ferromagnetic phase in the material of the present invention, as well as a diamagnetic phase. The diamagnetic phase reveals the classical butterfly signature of type II superconductivity after the ferromagnetic phase signal is subtracted. Diamagnetic signatures of superconductivity disappear at temperatures above about 250K, while the ferromagnetic component still exists at room temperature. Also, the appearance of the diamagnetic component at temperatures below about 250K is clearly visible in the MO imagery measurements performed. When the results from the MO imagery measurements are considered along with the magnetization measurements, the ferromagnetic phase appears to be located in the deeper layers of the ablation region of the strontium ruthenate crystal beneath the laser processed surface while the diamagnetic phase appears to exist where the material is changed from the strontium ruthenate crystal due to the laser ablation.

Though quenching of the exhibited superconductivity characteristics by a magnetic field was not performed, quenching of the exhibited superconductivity characteristics by current was performed. The estimated value of the critical current and the amplitude of the diamagnetic response are within the reasonable ranges for superconductivity behavior, as discussed in further detail in the examples provided below.

EXAMPLE 1

Sample preparation. A schematic illustration of a sample 100 including the superconductive material of the present invention, which is manufactured by the process of the present invention, is provide in FIG. 1. All samples 100 of the superconductive material of the present invention were manufactured from a strontium ruthenate crystal (not shown). The strontium ruthenate crystal may be a variety of strontium ruthenate crystals of the Ruddlesden-Popper series generally exhibiting the formula $Sr_{n+1}Ru_nO_{(3n+1)}$. Preferably, the nominal composition has n=1 but which may include some presence of some portions of the crystalline lattice where n=2 or n=3, as would be apparent to one skilled in the art. The starting strontium ruthenate crystal may exhibit triplet superconductivity behavior at about 1K. The strontium ruthenate crystal may be grown in accordance with current standard procedures.

Using the natural anisotropy of such crystals, many strontium ruthenate slices (not shown), sliced perpendicular to the c-plane, are peeled from the initial crystal. In each sample, a strontium ruthenate slice is polished on opposing ab-plane faces (not shown) into a free-standing plate 101. The plate 101 may be about 25 µm thick (c-plane dimensions) and 1-3 mm in lateral (ab-plane) dimensions. While the particular dimensions of the plate 101 are not critical to the manufacturing process or the creation of the material of the present invention, the use of a very thin plate 101 is particularly useful for the resistance measurements and other examples provided herein in that any interference from non-processed portions of plate 101 are more easily taken into consideration. For example, while strontium ruthenate films have not been successful for showing triplet superconducting behavior because of impurities that form in the crystalline lattice of such films, strontium ruthenate films are believed to be appropriate for use in the present invention despite any impurities that may exist.

Figure 12:
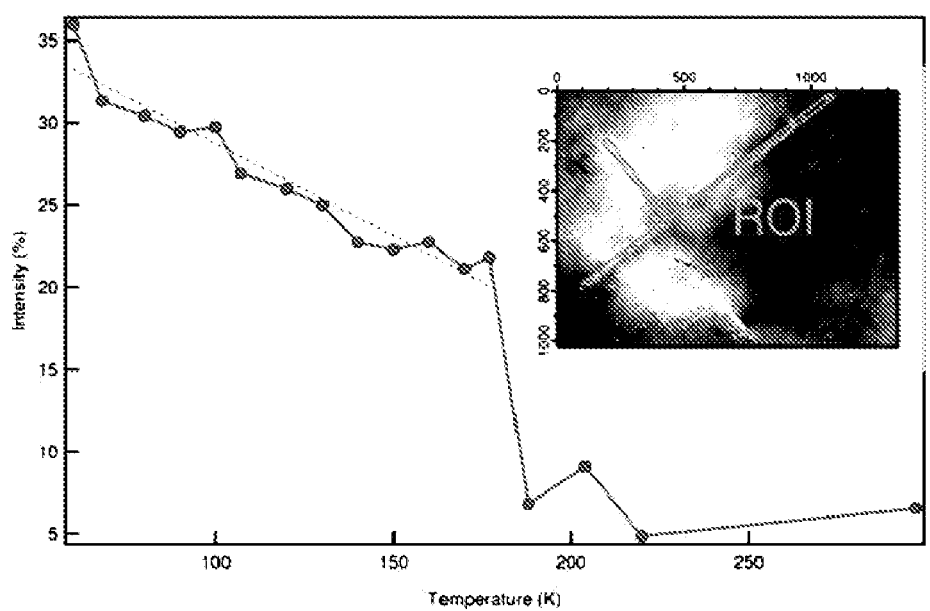
FIG. 12 is a plot of MO image intensity vs. temperature of the sample of FIG. 2A.

Plate 101 illustrated in the FIG. 1 is generally rectangular, although other geometries are contemplated by the present invention, for example a generally triangular plate 1201 is provided in FIG. 12. Each strontium ruthenate plate 101 was then mechanically bonded onto a substrate 103, for example by gluing, epoxy application or another procedure as would be apparent to one skilled in the art. The substrate may be any substrate that would be apparent to one of ordinary skill in the art, for example, glass strontium titanate, sapphire, silicone, etc. In alternative embodiments, the substrate may be omitted and the strontium ruthenate crystal may be laser processed without a substrate material.

Next, about a 3000 Å thick silver layer 105 was deposited on top of the glass substrate 103 and the mounted $Sr_2RuO_4$ plate 101. Silver layer 105 may be deposited by any method available to one of ordinary skill in the art, for example electron beam deposition, chemical vapor deposition, laser deposition, magnetron deposition or thermal evaporation. Silver layer 105 may not deposit easily onto some substrates, for example glass. As such, a very thin layer, for example 40-70 Å, of nichrome was deposited on top of glass substrate 103 and the mounted $Sr_2RuO_4$ plate 101 prior to the deposition of silver layer 105 by any of the methods discussed above for silver layer 105 or other method apparent to one of ordinary skill in the art. The nichrome may have the general formula Ni—Fe—Cr. Preferably, the nichrome has about 10% nickel, about 68% iron, about 17% Chromium and about 5% impurities. While it is not apparent what effects the nichrome may have had on the superconductivity characteristics exhibited in the material of the present invention, the present invention contemplates the use of other materials as would be apparent to one skilled in the art, such as titanium, to facilitate the adhesion of silver in the present invention.

Silver layer 105 is deposited as a conductive surface for the resistivity and other measurements performed as discussed below. Thus, while it is not apparent what effects the silver may have had on the superconductivity characteristics exhibited in the material of the present invention, the present invention contemplates the use of other conductive materials as alternatives to silver as would be apparent to one skilled in the art.

Laser micromachining was then used to form grooves 107 in sample 100. This includes grooves 107b on the silver layered glass substrate 103 surrounding the silver layered strontium ruthenate plate 101, and grooves 107a that further define four conductive legs 108 extending to within about 10 microns of the center of the strontium ruthenate plate 101. The about 10 µm bridge 106, where grooves 107a do not extend at the center of the strontium ruthenate plate, 101, is preserved to make the plate 100 available for resistance measurements. As such, voltage connections 111 and current connections 113 are provided on the conductive legs 108 of the silver layer 105 of the glass substrate 103. Voltage connections 111 and current connections 113 may be any conductive material apparent to one of ordinary skill in the art, for example wire-bonding, silver paint, indium wire, etc. Bridge 106, however, may be as small as 1 µm. In alternative embodiments, the grooves 107 may be omitted as it is not apparent that the grooves affect the nature of the material formed by the laser processing, but merely facilitate resistive testing of the material.

Finally, laser ablation was used to remove the silver layer 105 from a laser processed region 109 of the strontium ruthenate plate 101. The laser micromachining of grooves 107 and the laser ablation of the laser processed region 109 were performed using a solid state UV-laser (3rd harmonics of IAG generator) with 10 ns pulse duration and 0.1 mJoule pulse energy. The beam was focused by short focal length lens into a spot down to 1 µm in diameter, which provided beam power up to $10^{12}$ W/cm$^2$ in the focal spot. The sample 100 was located on a moving table with computer controlled movement.

Figure 2A:
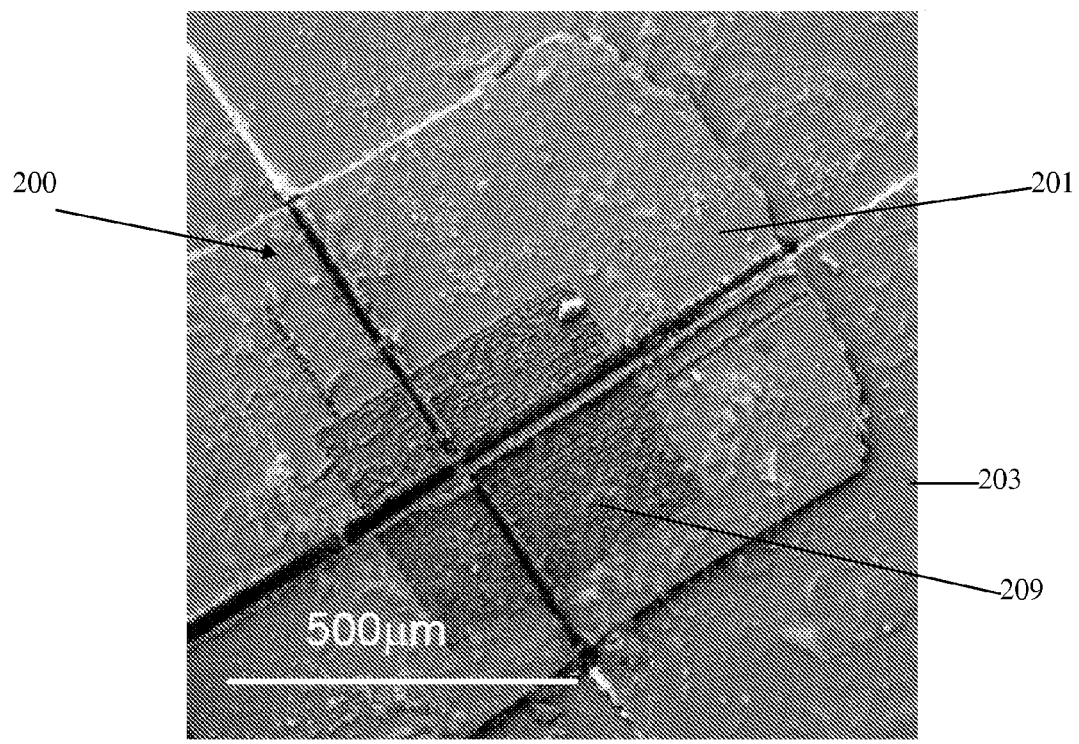
FIG. 2A is a scanning electron micrograph images of a sample including superconductive material of the present invention at a scale indicated by a line marked 500 microns on the figure.
Figure 2B:
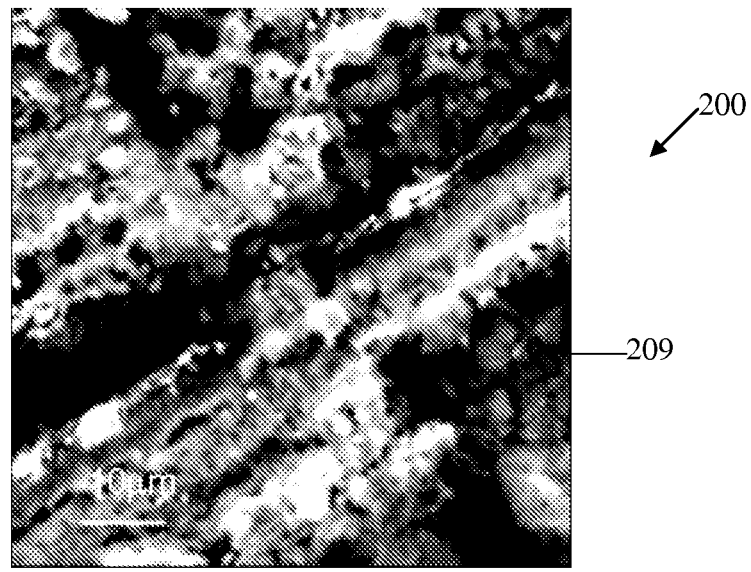
FIG. 2B is a scanning electron micrograph images of the sample of FIG. 2A at a scale indicated by a line marked 10 microns on the figure.
Figure 3A:
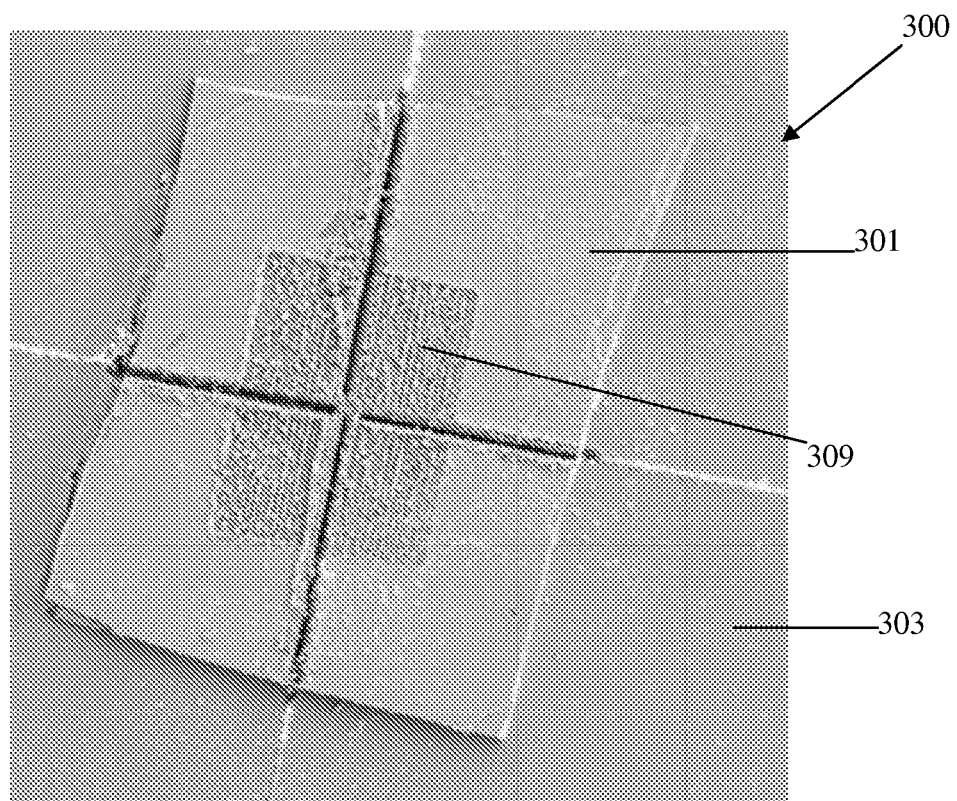
FIG. 3A is a scanning electron micrograph images of another sample processed identically to that of FIG. 2A including superconductive material of the present invention.
Figure 3B:
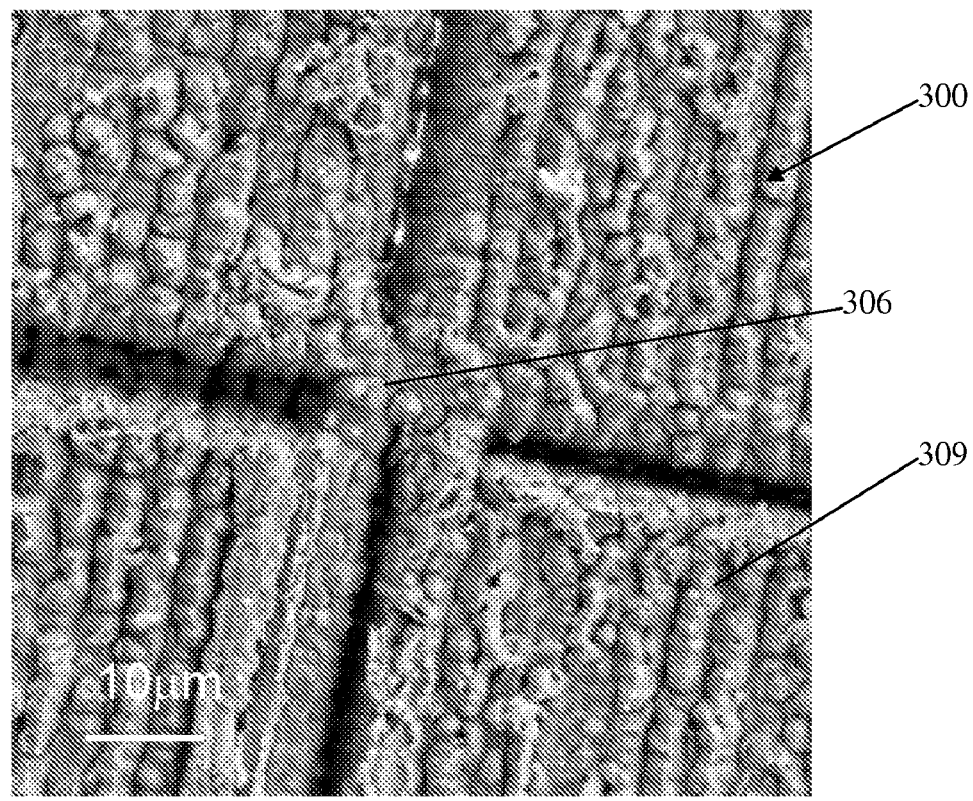
FIG. 3B is a scanning electron micrograph images of the sample of FIG. 3A at a scale indicated by a line marked 10 microns on the figure.

The scanning electron micrograph (SEM) image of a sample 200 provided in FIG. 2A shows the resulting laser processed region 209 on a silver layered strontium ruthenate plate 201 disposed on a glass substrate 203 at a scale indicated by a line marked 500 microns on the figure. FIG. 2B shows the laser processed region 209 of sample 200 on at a scale indicated by a line marked 10 microns on the figure. The SEM image of a sample 300 is provided in FIG. 3A showing the resulting laser processed region 309 on a silver layered strontium ruthenate plate 301 disposed on a glass substrate 303 at a scale indicated by a line marked 500 microns on the figure. In sample 300, however, the strontium ruthenate crystal plate 301 was laser ablated 8-fold, in other words the laser beam went back and forth 8 times., which made the bridge 306 thinner. The SEM image of sample 300 provided in FIG. 3B shows a resulting laser processed region 309 at a scale indicated by a line marked 10 microns on the figure. As shown in FIGS. 2A, 2B, 3A and 3B, the laser processed regions 209/309 are very lumpy and of non-uniform reflectivity. The top or "crust" layer of the laser processed regions 209/309, which was most affected by the laser processing, has superconductor characteristics with a transition in the 200-250 K range. Based on the number of laser passages across the laser processed region 209 and a known depth at which the laser generally cuts per pass, the top or "crust" layer thickness is estimated to be about 4-5 µm of the about 25 thickness of the strontium ruthenate plate 201.

Special protection from air appears not to be necessary. Samples 200/300 were stored in air without any desiccators or surface passivation layer. Moreover, sample 200 displayed consistent signatures of superconductivity at times separated by a year of such storage.

EXAMPLE 2

Sample composition. X-ray microanalysis provided via Energy Dispersive X-ray (EDX) indicates the average composition to be silver-doped $Sr_2RuO_{6\pm x (x<1)}$. The results of the X-ray microanalysis are provided in Table 1. According to depth measurements taken via EDX, silver-doped $Sr_2RuO_{6\pm x}$ ($x<1$) appears to persists to a depth of not more than 2 μm from the upper surface of the original strontium ruthenate crystal. However, as discussed above, estimated depths based on known depths for laser ablation suggest that laser processed region 209 has a depth of about 4-5 microns of the 25 micron strontium ruthenate crystal. At the very least it is clear that the overall depth is on the single micron order, or less than 10 microns and greater than 1 micron. As follows from Table 1, the Sr/Ru ratio in the top layer is about 2, which demonstrates that the laser processing of the present invention includes a material change involving additional oxygen.

TABLE 1

| Element | SEM Microprobes (in at %) | | | Average |
|---|---|---|---|---|
| Strontium | 21.50 | 23.36 | 22.53 | 22.46 |
| Ruthenium | 10.43 | 11.51 | 10.91 | 10.95 |
| Oxygen | 65.98 | 64.75 | 65.86 | 65.53 |
| Silver | 2.09 | 0.38 | 0.70 | 1.06 |

The presence of excess oxygen is the most striking feature in Table 1. There is also some presence of silver. It is clear that both excess oxygen and silver doping are introduced from the free surface as a result of the laser processing. Thus, at sufficient depth into the laser processed region, for example region 209, the composition should correspond to the strontium ruthenate crystal, for example the crystal 201 with four atoms of oxygen (—$O_4$) rather than six atoms of oxygen (—$O_6$). Similarly, at sufficient depths no silver should be present. Intermediate compositions are obviously present between the top layer and the strontium ruthenate crystal of the deeper layers. As will be seen in the examples below, these intermediate layers also have properties such as ferromagnetism, paramagnetism and superconductivity.

EXAMPLE 3

Figure 4A:
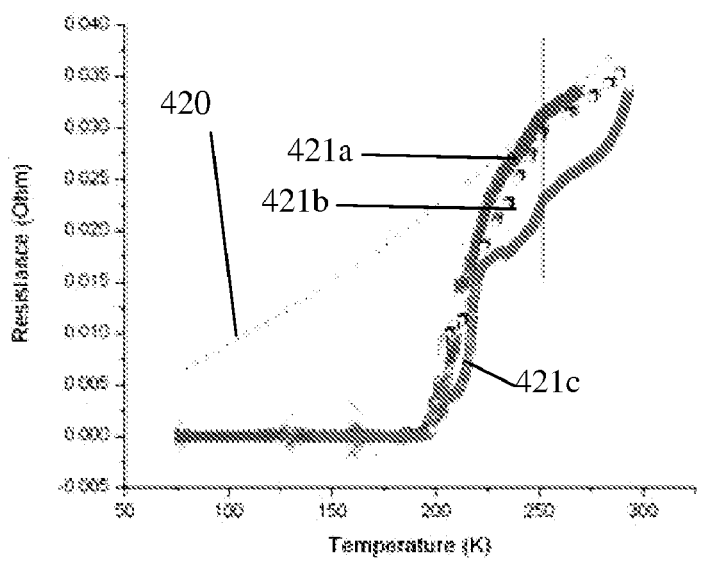
FIG. 4A are plots of resistance versus temperature for the sample of FIG. 2A.
Figure 4B:
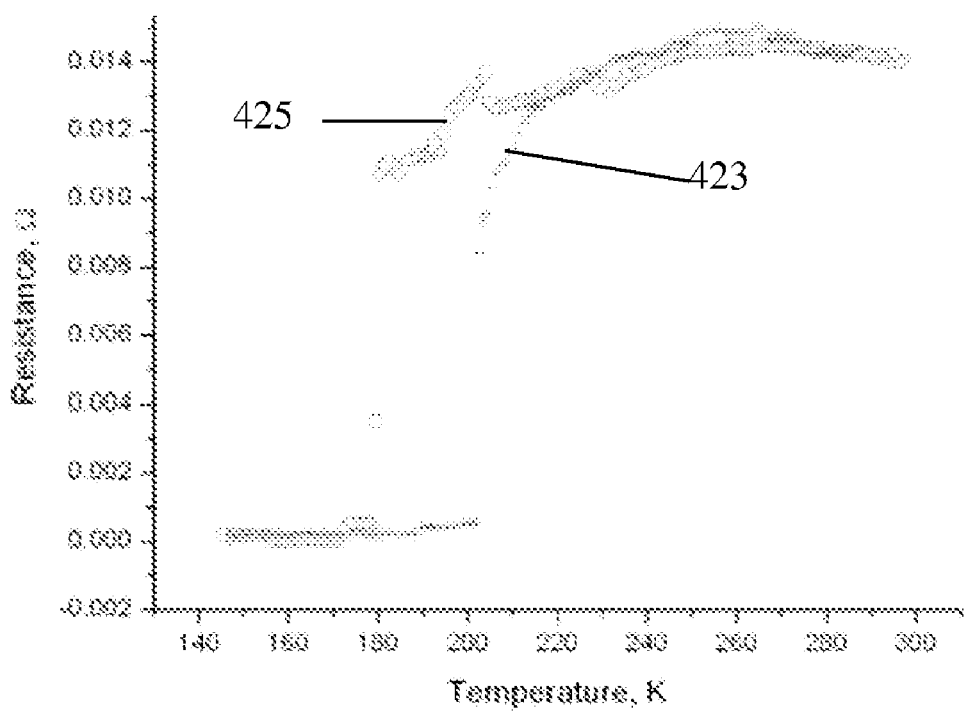
FIG. 4B is a plot of resistance versus temperature for the sample of FIG. 2A measured in a direction orthogonal from FIG. 4A.

Resistivity measurements. The laser processed regions 209/309 of both samples 200 and 300 show a resistivity transition. Multiple resistive transitions were recorded with two-probe and four-probe laboratory setups with the probes made of the same material and directly connected to the non-laser ablated silver layer 105 on the legs 108 defined by grooves 107a. Curves for sample 200 are shown in FIGS. 4A and 4B. Resistive measurements with sample 200 were performed in two different experimental setups. Different contact pads were chosen in FIGS. 4A and 4B. In FIG. 4B, the direction of the current during the measurements was geometrically orthogonal to the current during the measurements of FIG. 4A. Thus, the resistance values of the bridge 106 at 300K are not identical. Further, in FIG. 4A, the resistance was measured at 1 mAmp current in a cryostat. In FIG. 4A, curve 421a represents the resistivity while sample 200 is heating up a first time, curve 421b represents the resistivity while sample 200 is cooling down, and curve 421c represents the resistivity while sample 200 is heated up a second time. Curve 420, however, represents the non-transitional effect of temperature on resistivity for the non-laser processed parent material. In FIG. 4B, curves 423 and 425 were measured at 10 mA in another cryostat. A non-linear heating mechanism was used in FIG. 4B, accounting for the sharper transition curves than in FIG. 4A, because of the current was 10 times that used in FIG. 4A. Curve 423 was measured while sample 200 was heating up. Curve 425 was measured while the sample was cooling down. The large current used in the formation of curve 423 of FIG. 4B almost surely produced the nearly 20K lag in transition over the curves of FIG. 4A.

Figure 5:
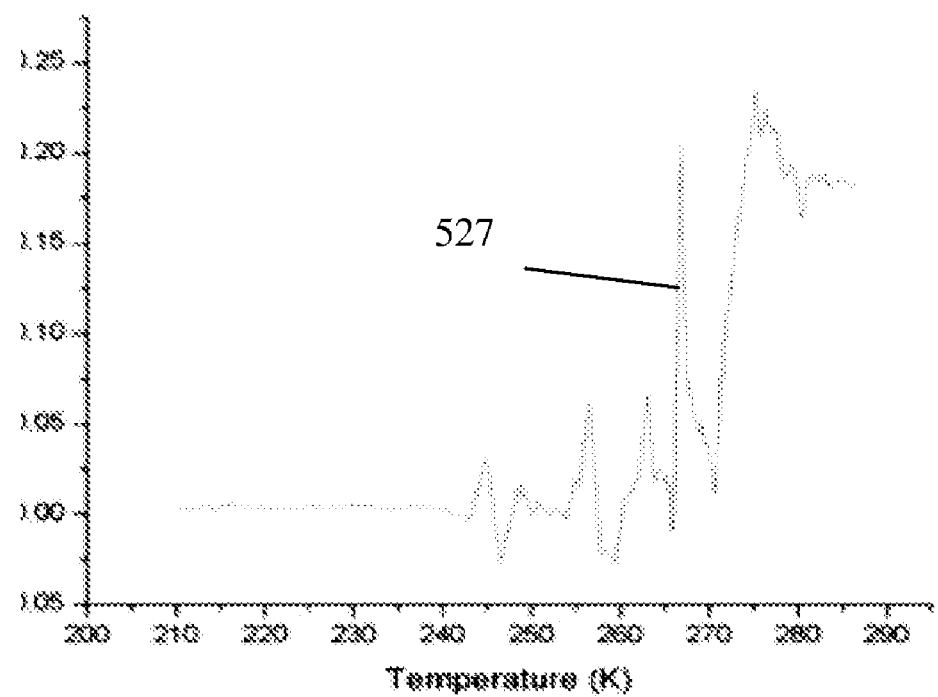
FIG. 5 is a plot of resistance versus temperature for the sample of FIG. 3A.

In FIG. 5, sample 300 demonstrated the same type of transition as illustrated for sample 200 in FIG. 4A. Curve 527 in FIG. 5 was measured at 10 μAmp.

Figure 6:
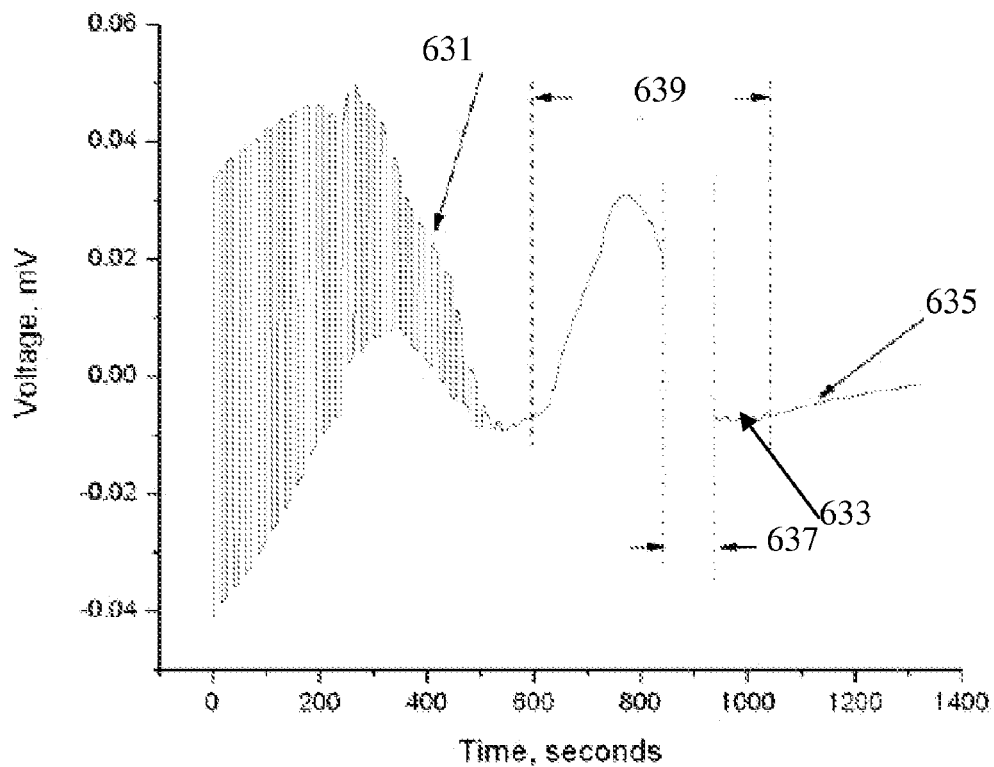
FIG. 6 is a plot of voltage over time, as the temperature of the sample in FIG. 2A cooled measured with a DC current of alternating polarity.

FIG. 6 illustrates the suppression of the onset temperature in the raw data caused by increasing the measuring current, as the sample cooled. In particular, FIG. 6 plots the voltage vs. time during the cool down, which was measured with a DC current of alternating polarity passing through sample 200. Accordingly, voltage jumped up and down with the change in polarity, so that the height of the vertical lines is the measure of the resistance of sample 200. At times prior to the transition at time=600, the slowly-alternating sign of the measuring current creates a rectangular periodic voltage structure, illustrated at area 631. At about 1 mAmp of registering current, the transition occurred at time=600 seconds. At the transition at time=600 seconds, this square wave pattern disappears and is replaced by the system noise and temperature dependent offset voltage associated with the thermoelectricity related leads from room temperature because of the cryostat wiring.

At about time=850 seconds, the current was switched to 10 mA with a lapsed time of about 100 seconds during the switch, illustrated by the break in the curve at 637. Switching to about 10 mAmp of registering current caused a return to the resistive state, which is represented by the ripples at area 633 near time=930 to 1050 seconds, followed by a new transition at area 635 at time=1050 seconds, corresponding to a change in the transition temperature of about 30-40K between about time=600 seconds and time=1050 seconds, at reference numeral 639. Comparing the height of periodic voltage before the transition with the noise amplitude after the transition, we deduce that the resistance dropped by a factor of at least about 6000.

Generally, the laser processed region 109, as illustrated in FIG. 1, can be considered a bridge with approximate sizes: length, l, about 10 μm, width, w, abut 10 μm, and height, h, about 25 μm. Resistivity, or ρ, is equal to Rwh/l, when R is resistance. When the measured resistance at 300K ($R_{300}$) is about 0.02Ω, resistivity ($ρ_{300}$) is about 50 μΩcm. For comparison, an estimated resistivity value $ρ_{300}$ for a $Sr_2RuO_4$ crystal (which is the starting material for sample 200) is about 100 μΩcm, calculated by considering a known Resistance, R, for $Sr_2RuO_4$ and similar bridge geometry as that of sample 200. See A. P. Mackenzie, Y. Maeno, "The superconductivity of $Sr_2RuO_4$ and the physics of spin-triplet pairing," *Rev. Mod. Phys.*, Vol. 75, pp. 657-712 (2003). However, below the transition above 200K, shown at time=600 seconds, resistivity, ρ, is less than 0.01 μΩcm, if the current flows through the whole laser processed region 109, and less than 0.001 μΩcm if the current flows through the micron-order top or "crust" layer of the laser processed region 109, which has a smaller height, h, than the whole laser processed region 109.

For comparison, it is difficult to achieve a resistivity as low as about 1 μΩcm at above 200K for highly conductive and non-superconductive materials, such as aluminum, gold and silver. Nonetheless, the material of the present invention appears to have about 100 to 1000 times lower resistivity. Thus, these very low resistivity values cannot be attributed to any non-superconducting metal. Moreover, one cannot explain such a drastic change in resistance by a shunting effect since a factor of 6000 times resistance reduction would require a shunt of the same material to have a 6000 times larger cross section than the central connector. In other words the bridge 106 would have to be 6000 times the size, which would more than fill the grooves 107. However, there is not enough space within the laser processed region for the bridge 106 to be 6000 times the size. Transmission light microscopy with illumination from underneath the sample shows no additional material within the grooves. Also, in the event that optically invisible nanobridges exist and are responsible for the 6000 times reduction in resistance, which is not likely the case, then the nanobridges themselves are the material of the present invention that exhibits high-temperature superconductor behavior. Further, even if such optically invisible nanobridges filled the grooves, their volume would likely be too small to produce the amplitude of the diamagnetic signal discussed in Example 4 below.

EXAMPLE 4

Magnetization measurements by SQUID-magnetometer. The Meissner effect is a characteristic attributed to superconducting material that is demonstrated in three ways. When magnetic susceptibility measurements of the laser processed region are plotted against temperature for a field cooled environment, i.e., a magnetic filed is applied and then the sample is cooled, and a zero field cooled environment, i.e., the sample is cooled and then a magnetic filed is applied while heated, there should be a separation between the curves at temperatures below the transition temperature. Also, the magnetic susceptibility of the laser processed region when measured in the zero field cooled environment should be negative just below the transition temperature. Also, when magnetic susceptibility measurements of the laser processed region are plotted against the application of a magnetic field a "butterfly effect" is apparent, since a magnetic field is expelled below the transition temperature for superconductive materials.

Figure 7A:
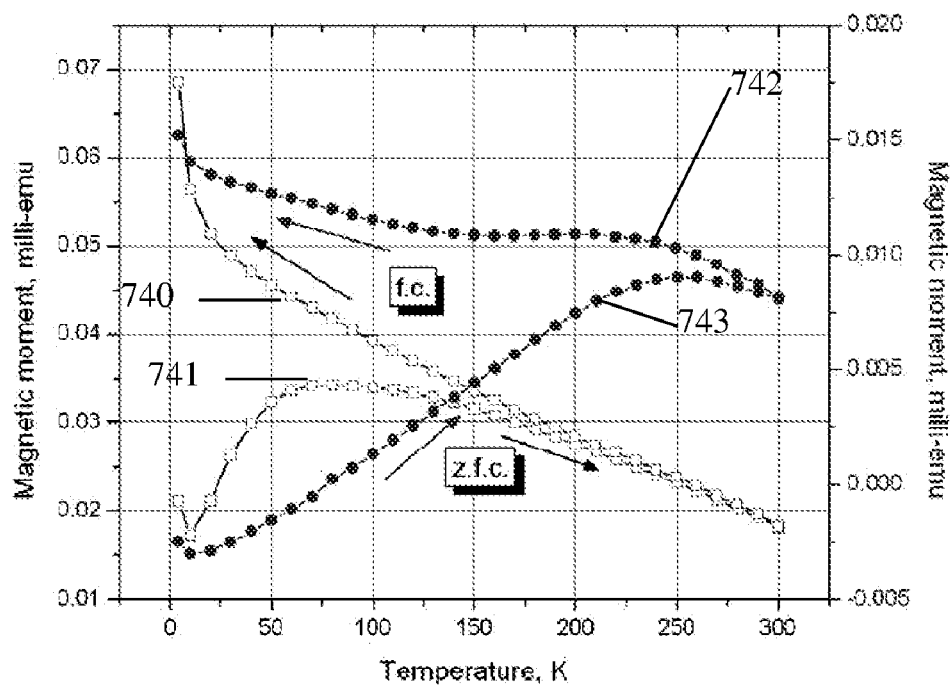
FIG. 7A is a plot of magnetic moment vs. temperature for the sample in FIG. 2A measured in the presence of two different magnetic fields in both a field cooled and zero field cooled environment.
Figure 7B:
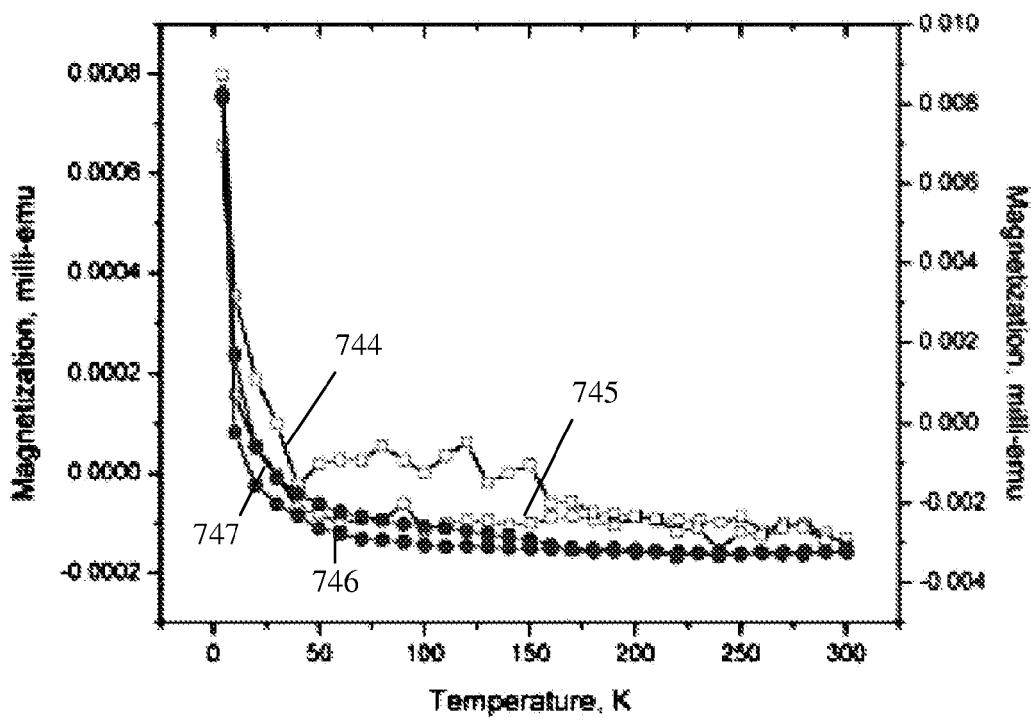
FIG. 7B is a plot of magnetic moment vs. temperature for a non-laser processed strontium ruthenate material in the presence of a magnetic field of two different values in both a field cooled and zero field cooled environment.

Thus, to trace the Meissner effect, magnetic susceptibility (also called magnetic moment) measurements were taken via a SQUID-magnetometer (Quantum Design MPMS model). The results are shown in FIGS. 7A-7C, 8A-8F and 9A-9D. FIG. 7A illustrates the raw data for magnetic moment vs. temperature for laser-processed sample 200. For comparison, FIG. 7B illustrates the raw data for magnetic moment vs. temperature for a non-laser processed strontium ruthenate material (not shown), also referred to as parent material. In FIG. 7A, curves 740 and 741 with the clear squares represent measurements taken in the presence of a magnetic field, H, of about 100 Oe. The magnetic moments of curves 740 and 741 are measured on the scale to the left of the plot. Curves 742 and 743 with the dark circles represent measurements taken in the presence of a magnetic field, H, of about 10 Oe. The magnetic moments of curves 742 and 743 are measured on the scale to the right of the plot. However, FIG. 7B has the opposite designations. Curves 744 and 745 with the clear squares represent measurements taken in the presence of a magnetic field, H, of about 10 Oe. The magnetic moments of curves 744 and 745 are measured on the scale to the left of the plot. Curves 746 and 747 with the dark circles represent measurements taken in the presence of a magnetic field, H, of about 100 Oe. The magnetic moments of curves 746 and 747 are measured on the scale to the right of the plot. Curves 740 and 742 were measured in a field cooled (f.c.) environment and curves 741 and 743 were measured in a zero-field-cooled (z.f.c.) environment.

Figure 7C:
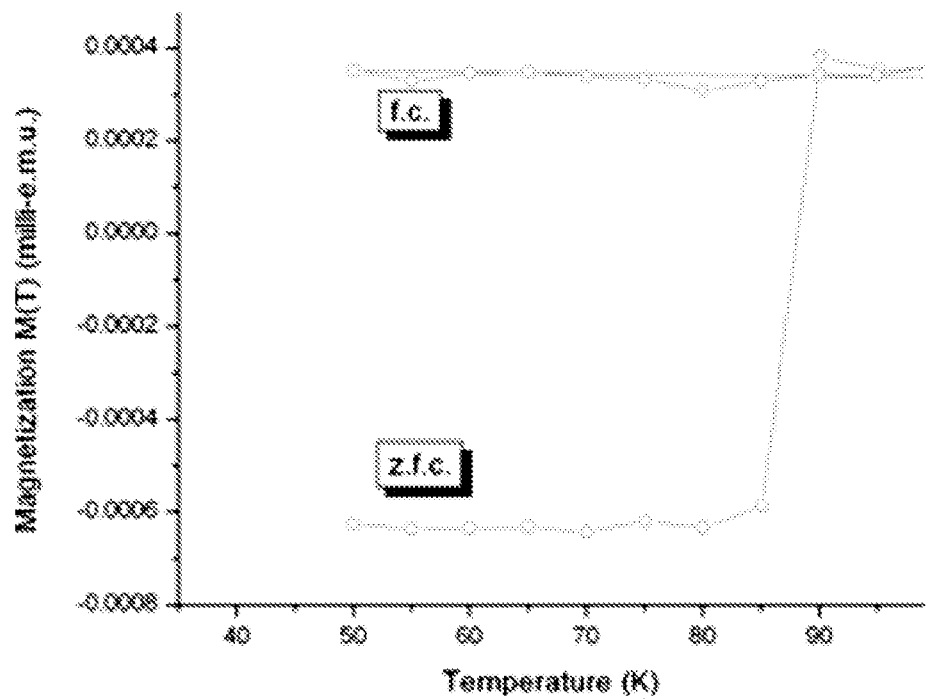
FIG. 7C is a plot of magnetic moment vs. temperature for a known superconducting material YBCO in the presence of a magnetic field of only one value in both a field cooled and zero field cooled environment.

For comparison, FIG. 7C is a plot similar to that of FIG. 7A for YBCO, a known superconducting material in the presence of a single magnetic field. The YBCO film is of 0.3×0.3 mm$^2$ in area and 0.4 microns thick, and the magnetic moment was measured in the presence of a magnetic field, H, of about 10 Oe. Although there is a clear separation of the curves below the transition temperature and the zero filed cooled curve 743 falls below zero on the right hand scale just after the transition temperature, the resultant curves for the laser processed region 209 of sample 200 in FIG. 7A do not illustrate the Meissner effect as cleanly as for a known superconductive material, such as YBCO in FIG. 7C, which suggests that there may be some positive additional ferromagnetic or paramagnetic contribution from the parent material present in the material of the laser processed region 209 of sample 200. By comparison of FIGS. 7C and 7A, the magnetization amplitude of the non-laser processed YBCO film is a factor of 20 smaller than that of laser processed region 209 of sample 200.

Diamagnetic and ferromagnetic responses causes each of curves 740, 741, 742 and 743 in FIG. 7A to start at positive values and provides for the dramatic slope changes in curves 740, 741, 742 and 743. Diamagnetism is known to cause changes in slope of for zero field cooled curves, which accounts for the change of slope at a temperature of about 250K for curve 743, and at about 70K for curve 741. Also the sign of the slope of curves 743 and 741 demonstrate that the diamagnetic signal exceeds the ferromagnetic one at temperatures lower than the transition temperature.

Figure 7D:
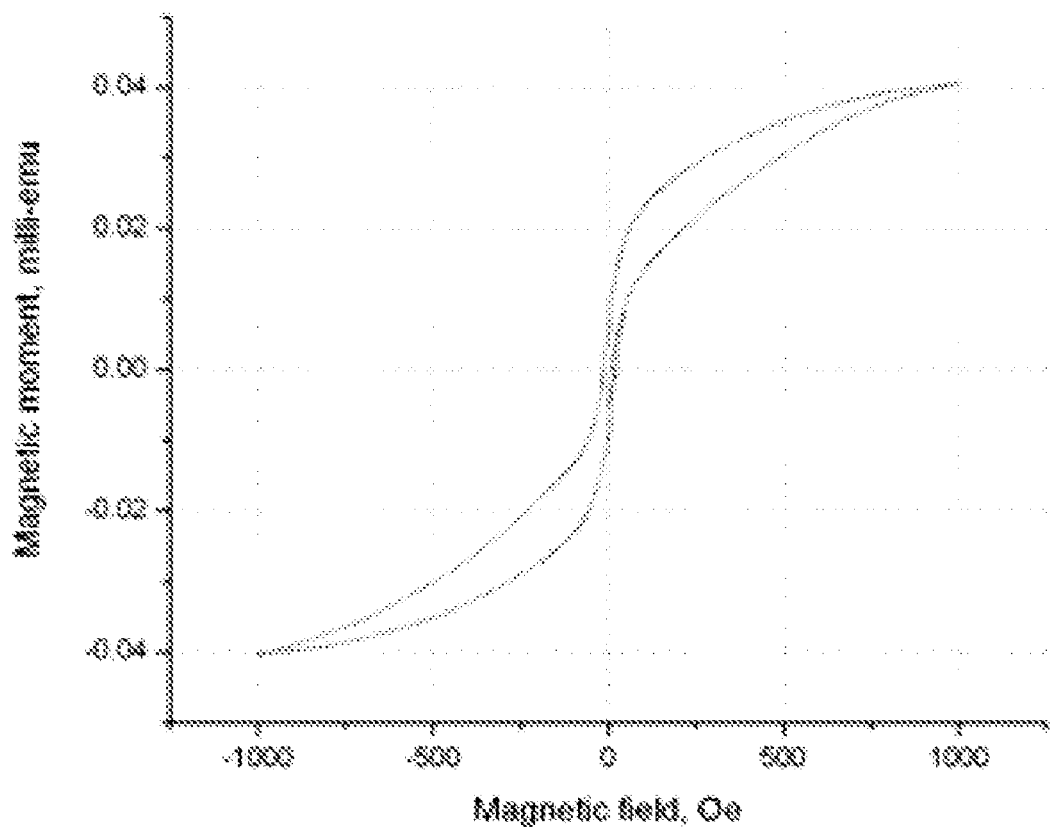
FIG. 7D is a plot of magnetic moment vs. magnetic field for the sample in FIG. 2A at 300K where there is no superconductive diamagnetism.

Since FIG. 7A reveals that ferromagnetism is likely present at room temperatures in the processed samples, FIG. 7D, which is a plot of magnetic moment vs. magnetic field at 300K, room temperature, where there is no superconductive diamagnetism, further demonstrates that some ferromagnetism exists in laser-processed sample 200 at 300K.

The ferromagnetic effects present at 300K in the laser-processed region 209 of sample 200, as illustrated in FIG. 7D, are absent in the parent material, which is discussed further with respect to FIGS. 8E and 8F below. It is believed that the nichrome, which include the ferromagnetic elements iron, chrome and nickel, may be what contributes to the ferromagnetic behavior of the laser processed region 209 of sample 200.

Figure 7E:
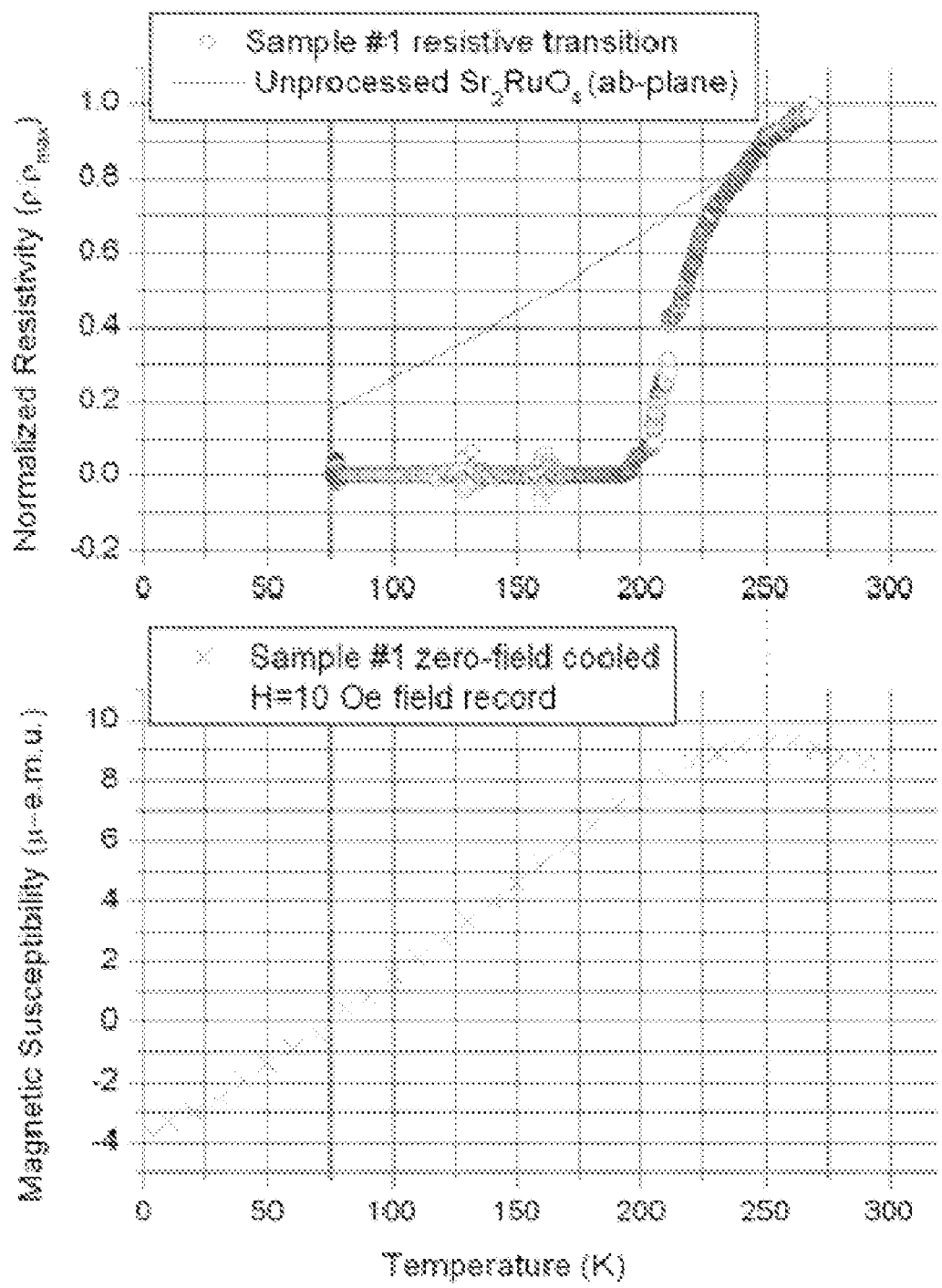
FIG. 7E is a side by side comparison of magnetization data from FIG. 7A and resistivity data from FIG. 4B for the sample of FIG. 2A.

FIG. 7E is a side by side comparison of magnetization data (zero field curve 743 from FIG. 7A) and resistivity data (curve 421b from FIG. 4B) for sample 200. At approximately the same temperature 250K, magnetic susceptibility and resistivity curves 743 and 421b change their slope, in other words shows a transition.

Figure 8A:
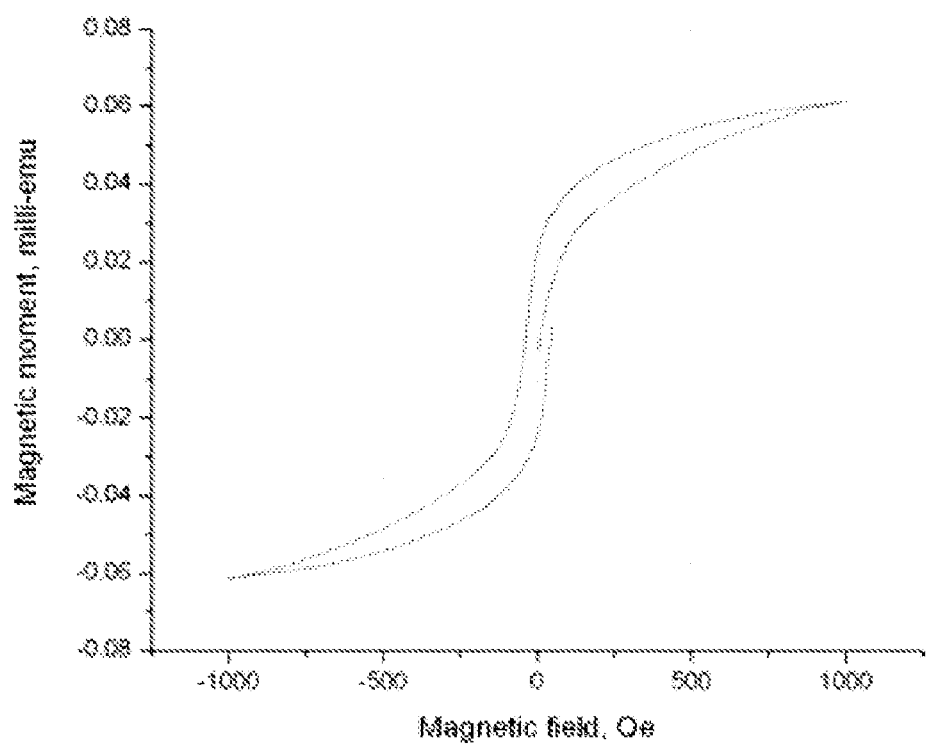
FIG. 8A is a plot of magnetic moment vs. magnetic filed for the sample of FIG. 2A at 100K.
Figure 8B:
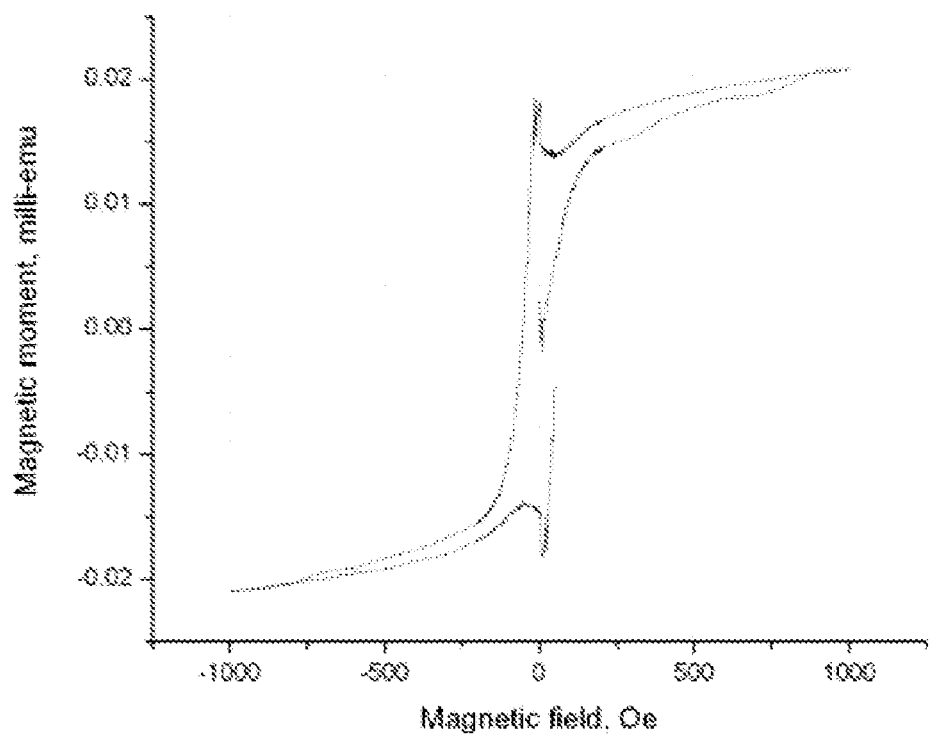
FIG. 8B is a plot of the data from FIG. 8A with the data of FIG. 7D subtracted.
Figure 8C:
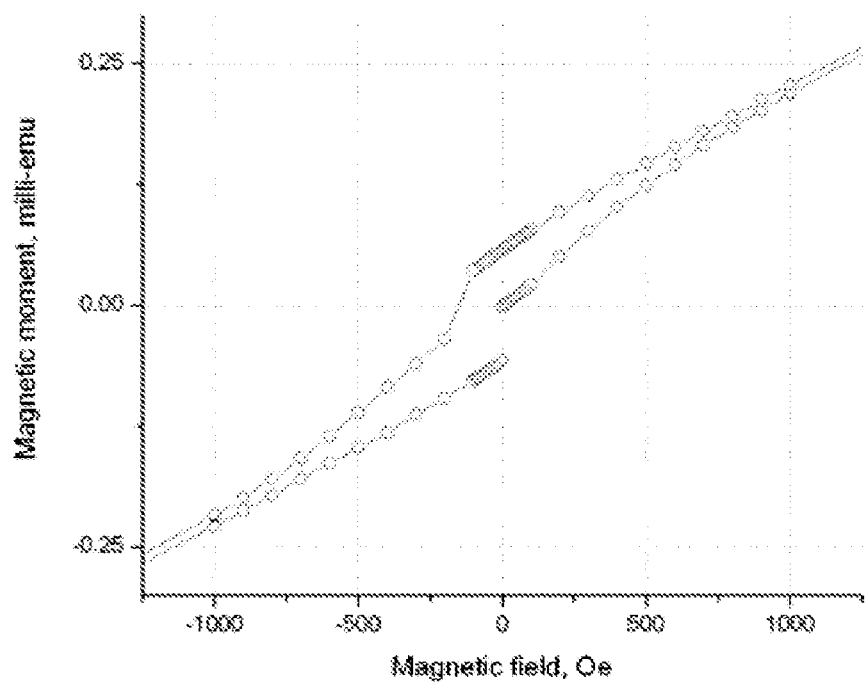
FIG. 8C is a plot of magnetic moment vs. magnetic filed for the sample of FIG. 2A at 4K.
Figure 8D:
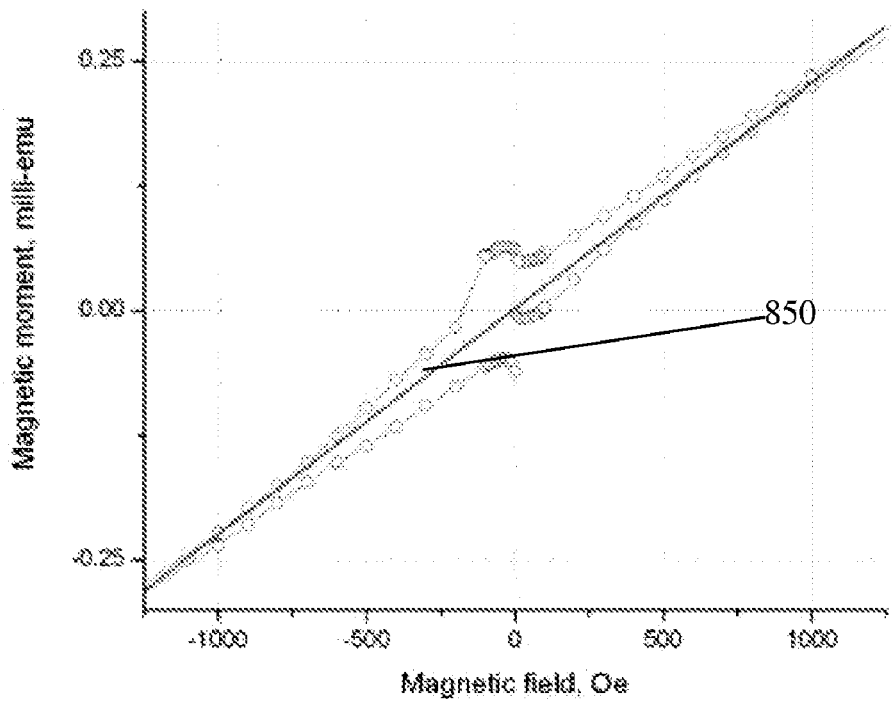
FIG. 8D is a plot of the data from FIG. 8C with the data of FIG. 7D subtracted.

The curves at 300K have exhibit a diamagnetic background effect because of the of the glass substrate, which is about 1 mm thick. FIGS. 8A-8F are plots of magnetic moment vs. magnetic field under various conditions. FIG. 8A is a plot of magnetic moment vs. magnetic filed for a laser processed region, such as region 209 of sample 200, at 100K. FIG. 8B is a plot of magnetic moment vs. magnetic filed for a laser processed region, such as laser processed region 209 of sample 200, at 100K but with the magnetic moment background data of FIG. 7D at 300K subtracted. FIG. 8C is a plot of magnetic moment vs. magnetic filed for a laser processed region, such as laser processed region 209 of sample 200, at 4K. FIG. 8D is a plot of magnetic moment vs. magnetic filed for a laser processed region, such as laser processed region 209 of sample 200, at 4K, but with the magnetic moment background data of FIG. 7D at 300K subtracted. In FIG. 8D, line 850 is representative of the paramagnetic background, which is discussed below with respect of FIG. 9A. FIG. 8E is a plot of magnetic moment vs. magnetic filed for a non-laser processed strontium ruthenate crystal, or parent material, at 4K. FIG. 8F is a plot of magnetic moment vs. magnetic filed for a non-laser processed strontium ruthenate crystal, or parent material, at 4K, but with magnetic moment background data generated for the non-laser processed strontium ruthenate crystal (not shown) subtracted.

Figure 8E:
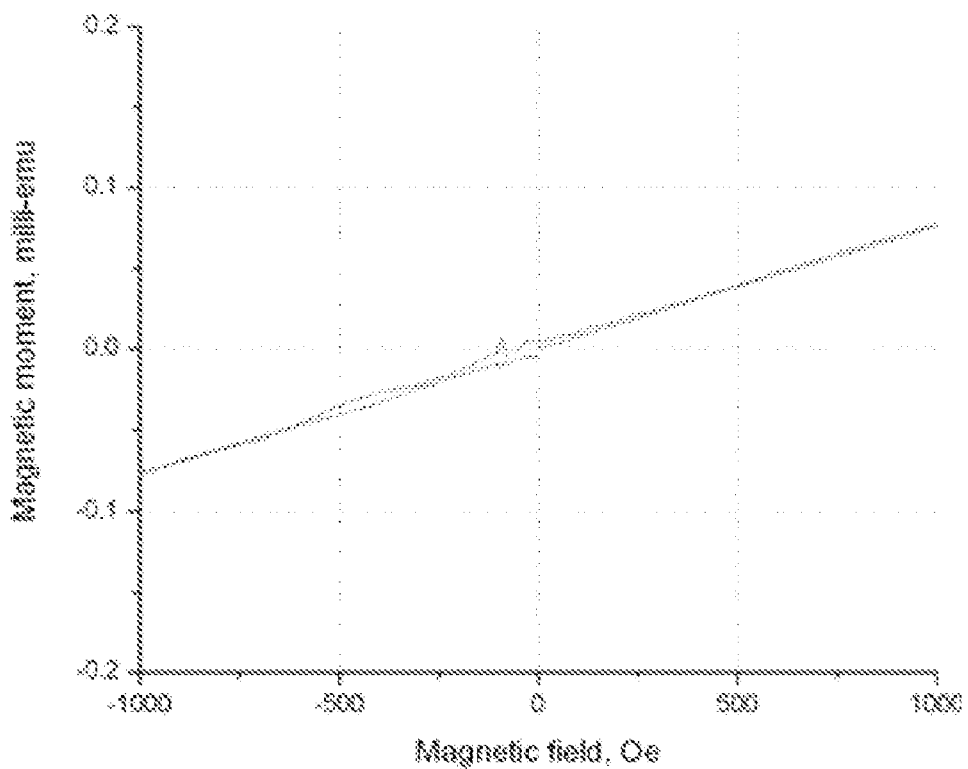
FIG. 8E is a plot of magnetic moment vs. magnetic filed for a non-laser processed strontium ruthenate crystal at 4K.
Figure 8F:
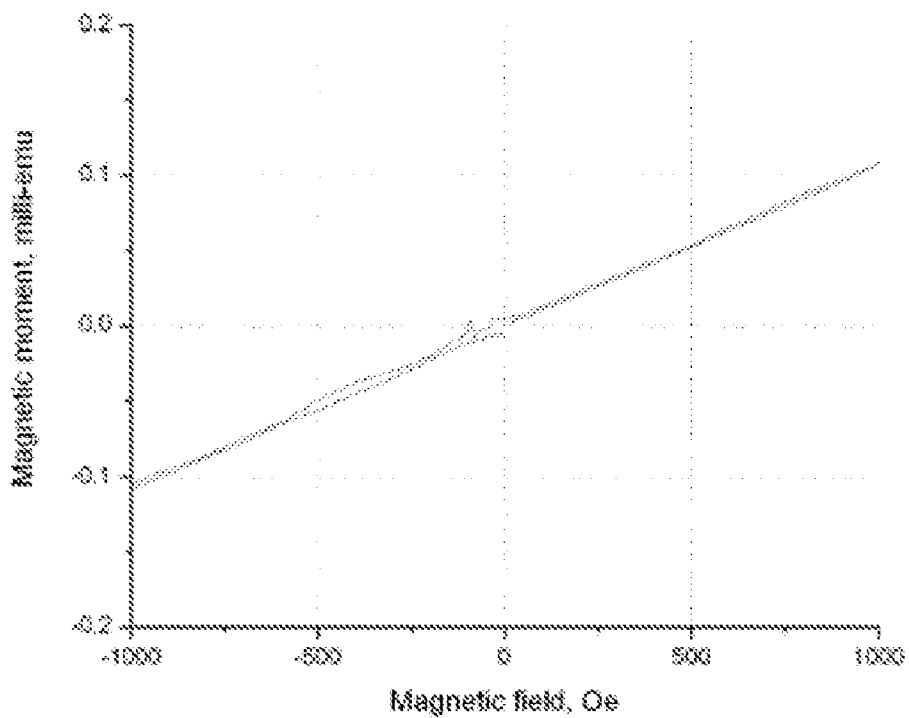
FIG. 8F is a plot of the data from FIG. 8E with measured background data of the non-laser processed strontium ruthenate crystal subtracted.

As shown in FIGS. 8B, 8D and 8F, the data exhibiting the diamagnetic background of the glass substrate can be easily subtracted from the raw magnetization data. When the data of FIG. 7D demonstrating the diamagnetic background of the glass substrate are subtracted from the raw data of the laser processed region illustrated in FIGS. 8A and 8C, the results, as illustrated in FIGS. 8B and 8D, respectively, show a signature similar to a distorted superconducting butterfly. When the background data of the glass substrate are subtracted from the raw data of the parent material illustrated in FIG. 8E, no such signature is evident as illustrated in FIG. 8F, in fact hardly any change is noticed between FIGS. 8E and 8F. Since the data of FIGS. 8E and 8F are only positive, the parent material demonstrates only paramagnetic behavior and no ferromagnetic behavior as does the laser processed region 209 of sample 200.

Figure 9A:
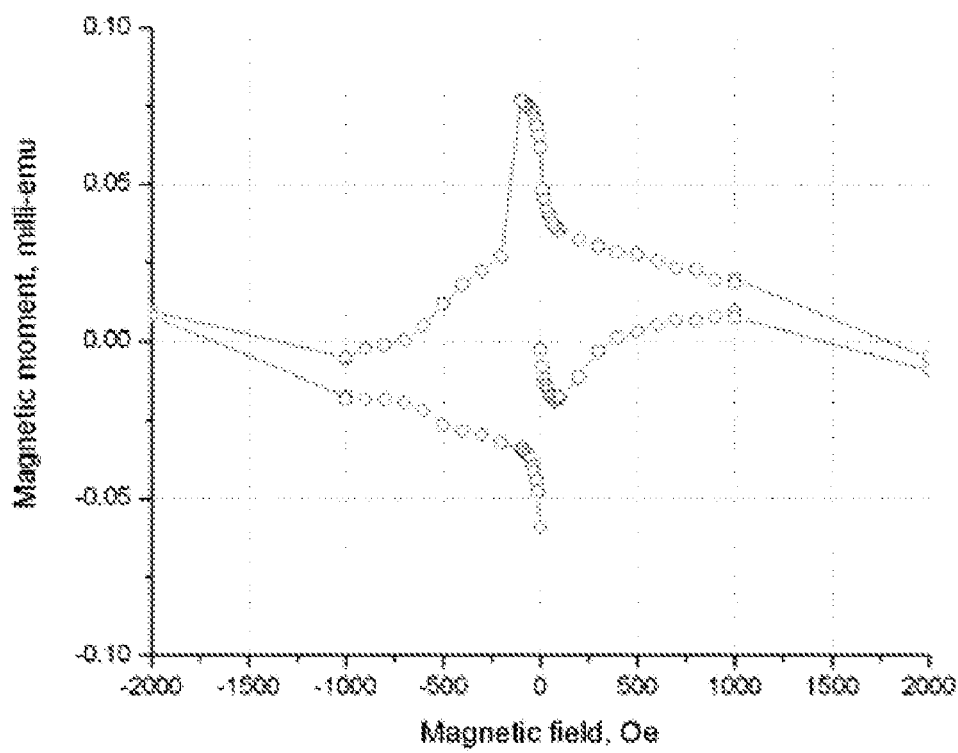
FIG. 9A is a plot of the data of FIG. 8D with data exhibiting the paramagnetism background from the parent material from FIG. 8D subtracted.
Figure 9B:
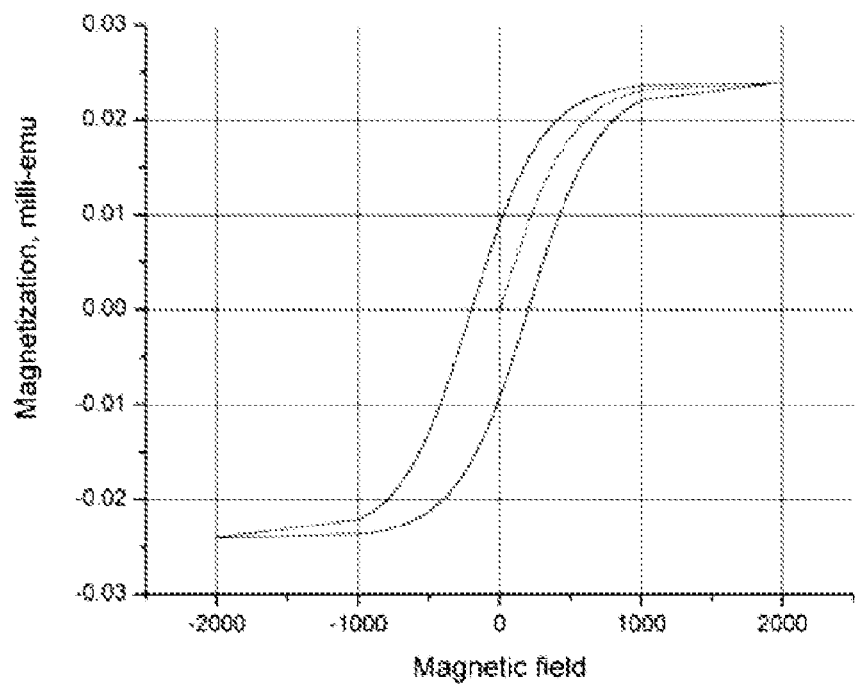
FIG. 9B is a computer model of an estimated change in magnetic moment vs. magnetic field at 4K over 300K.
Figure 9C:
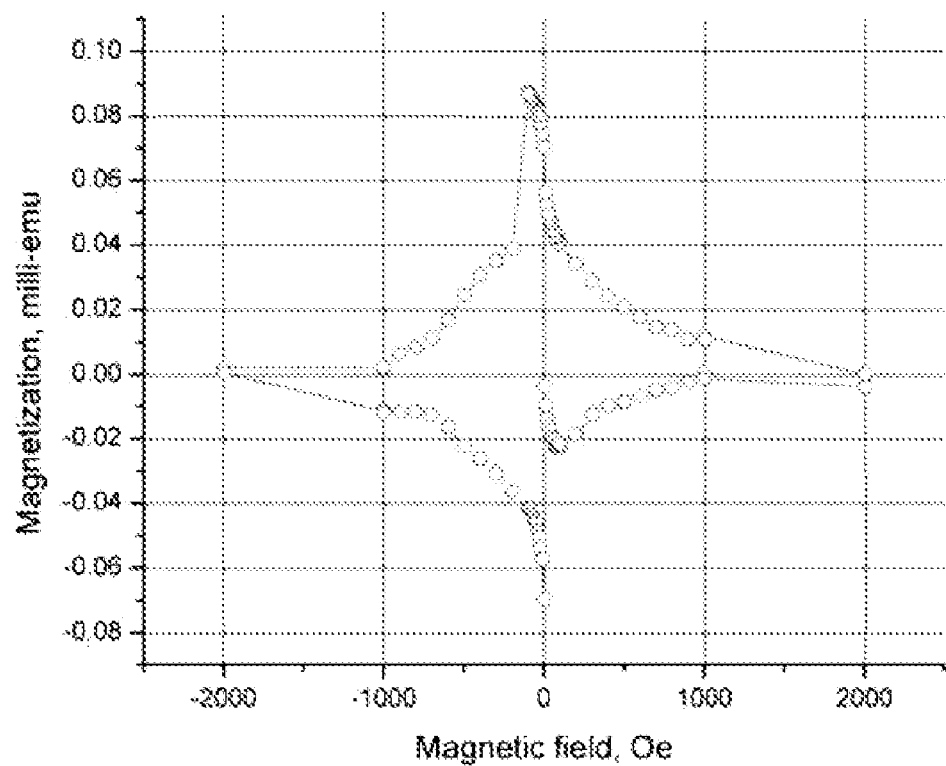
FIG. 9C is a plot of the data for FIG. 9A with the data of FIG. 9B subtracted.
Figure 9D:
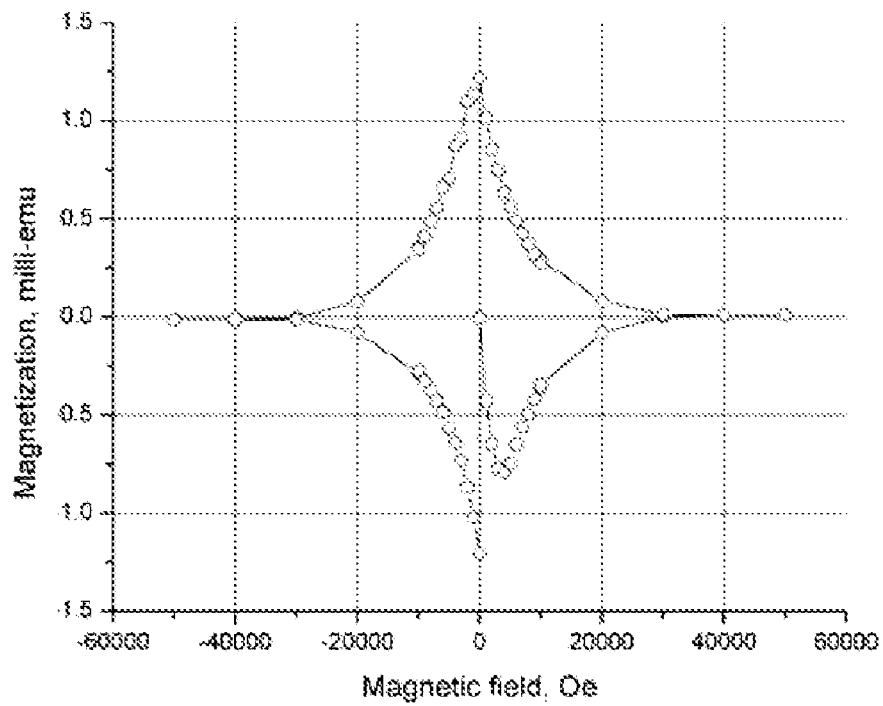
FIG. 9D is a plot of magnetic moment vs. magnetic field for $MgB_2$, a known superconductive material.

The paramagnetism of the parent material, which is noticeable in FIGS. 8E and 8F, also can be subtracted from the raw magnetism data. FIG. 9A is a plot of the magnetic moment of sample 200 at 4K (i.e., FIG. 8C) with the curves of FIG. 7D subtracted (i.e., FIG. 8D) and with the paramagnetism background from the parent material (i.e., line 850 in FIG. 8D) subtracted. It is suspected that a perfect butterfly is not achieved in FIG. 9A due to the additional ferromagnetic signal at 4K than at 300K, since FIG. 7D is measured at 300K and FIG. 8C was measured at 4K. Thus, FIG. 9B illustrates a computer model estimating the change in ferromagnetic signal at 4K over 300K. Subtracting the estimated model curves prepared in FIG. 9B from the curves of FIG. 9A yields the more perfect "butterfly" signature of FIG. 9C. For comparison, FIG. 9D is the classical "butterfly" signature demonstrated for a traditional superconductive material $MgB_2$. In separate experiments (not shown) it was demonstrated that the butterfly signature disappears at about 250K for the laser processed region 209 of sample 200. As FIGS. 9A and 9C demonstrates, the material of the present invention would be a classical type II superconductor due to the butterfly shape.

EXAMPLE 5

Figure 10A:
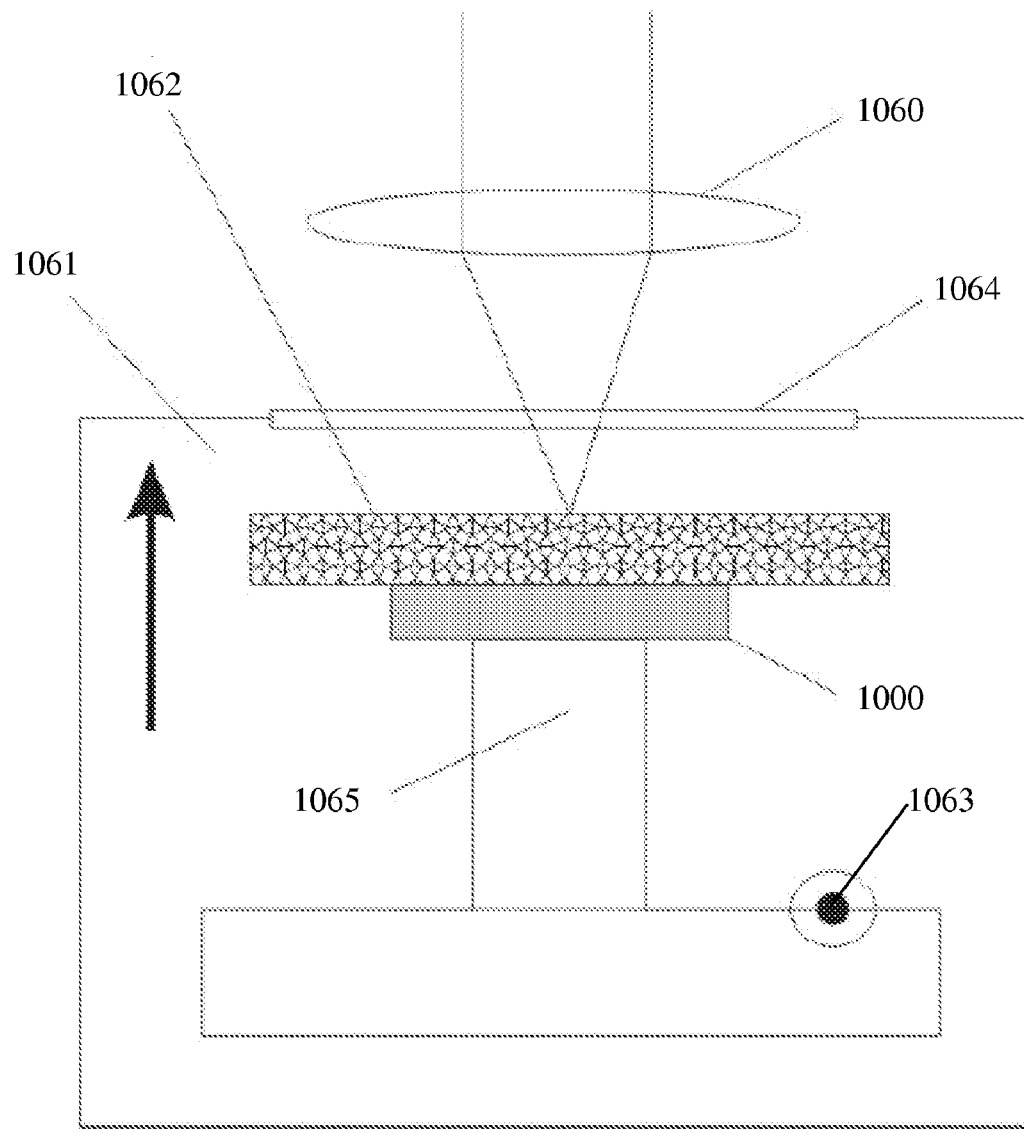
FIG. 10A is a schematic of the experimental arrangement for conducting magneto-optical (MO) imaging.

Magneto-optical imaging measurements. To better understand the laser-processed samples, magneto-optical (MO) imaging was employed. FIG. 10A illustrates the experimental arrangement for visualization of magnetic flux distribution via the Faraday effect. As discussed above, superconductive materials expel a magnetic field below a critical temperature. FIG. 10A is a schematic showing a custom assembled polarizing microscope 1060 built around a continuous-flow cryostat 1061. On top of a sample 1000 laser ablated according to the present invention, a Faraday cell 1062 is mounted. The Faraday cell 1062 may be any material exhibiting rotation of polarization of a photon as would be apparent to one skilled in the art, for example an epitaxially grown bismuth-substituted ferrite-garnet film with in-plane magnetization. The apparatus includes a thermometer 1063 and a window 1064. The geometry of thermometer 1063 and window 1064 are such that the sample 1000 cannot be colder than the thermometer 1063 through the use of a cold finger 1065 separating the sample 1000 form the thermometer 1063. The microscope 1060 illuminates the sample 1000 and Faraday cell 1062 with polarized monochromatic light. The light that is reflected off the plane separating the Faraday cell 1062 from the sample 1000 experiences a pronounced Faraday rotation of the polarization, the magnitude of which is proportional to the strength of a local magnetic field within the sample 1000. As such the presence and strength of a magnetic field in a sample 1000 is visible and recordable via the microscope 1060. In other words, the microscope 1060 acts to image magnetic flux lines expelled from a sample 1000.

Figure 10B:
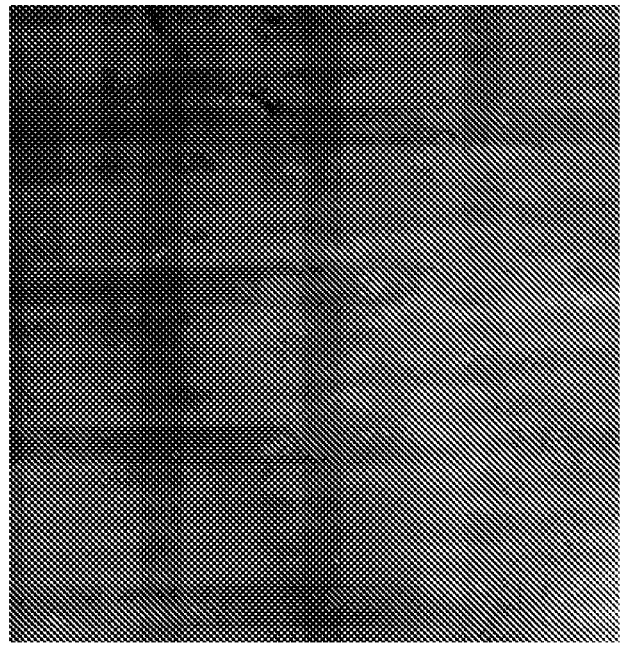
FIG. 10B is a MO image of a vertical strip of YBCO, a known superconductor, above its transition temperature.
Figure 10C:
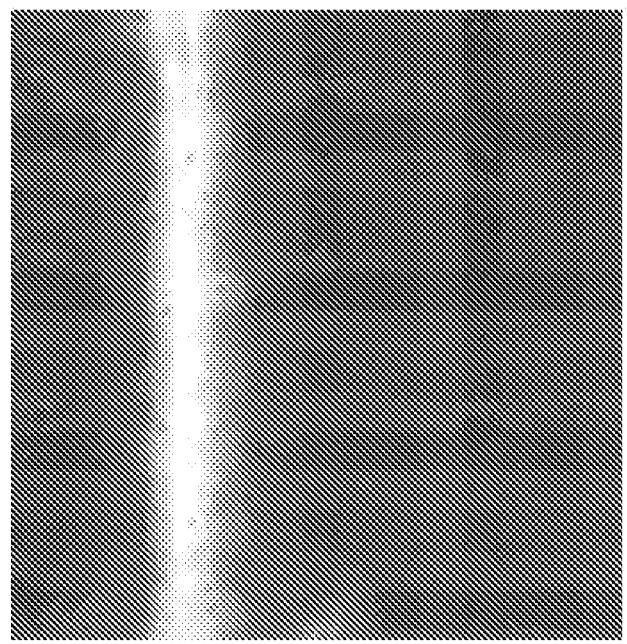
FIG. 10C is a MO image of the same vertical strip of YBCO as in FIG. 10B below its transition temperature.

As an Example of how microscope 1060 operates, FIGS. 10B and 10C are MO images of a scratch in a YBCO sample, which is a known superconductive material. FIG. 10B is a MO image of YBCO taken above the known transition temperature of YBCO. FIG. 10C is an MO image of YBCO taken below the known transition temperature of YBCO. Thus, magnetic flux lines are visible in MO imagery taken of superconductive materials when the temperature is below the transition temperature, when the superconductive nature of the material expels a magnetic field.

Figure 11A:
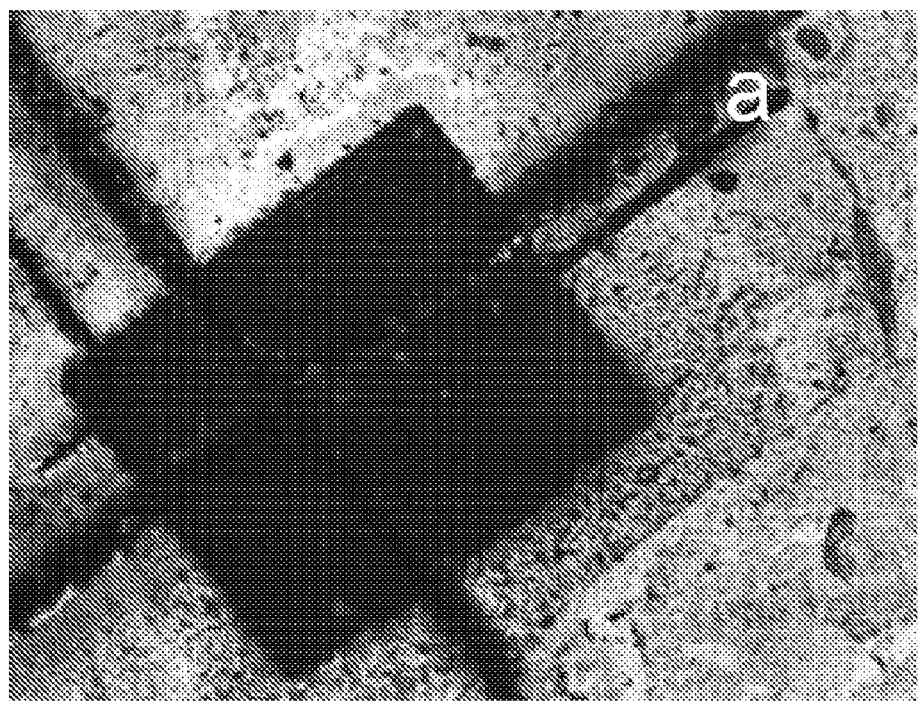
FIG. 11A is a microscope image of the sample of FIG. 2A.
Figure 11B:
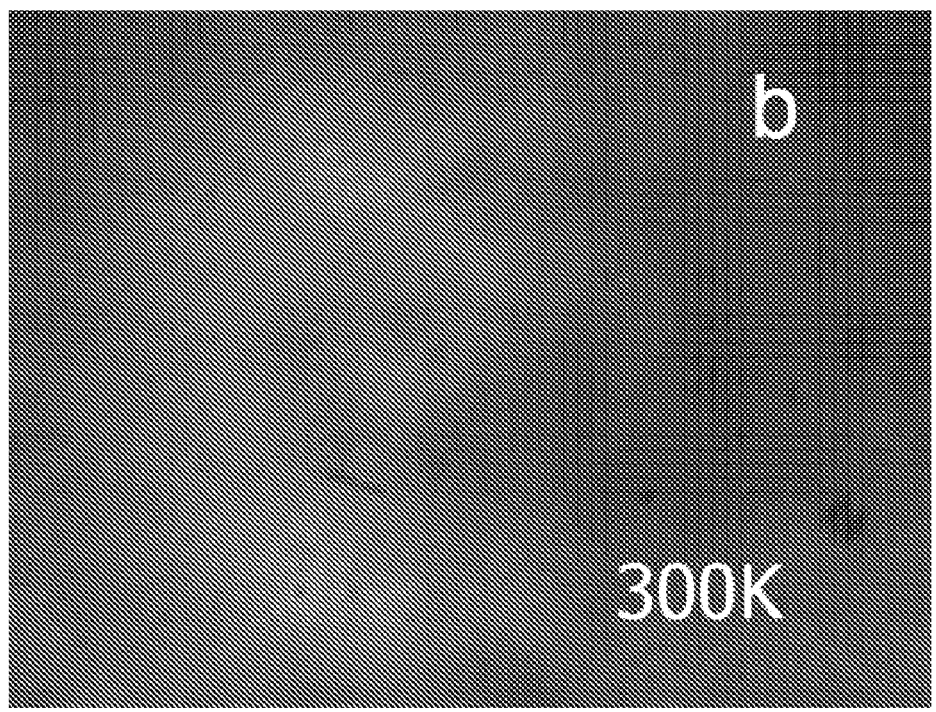
FIG. 11B is a MO image of the sample of FIG. 2A taken at 300K and at the same spatial orientation as the sample in FIG. 11A.
Figure 11C:
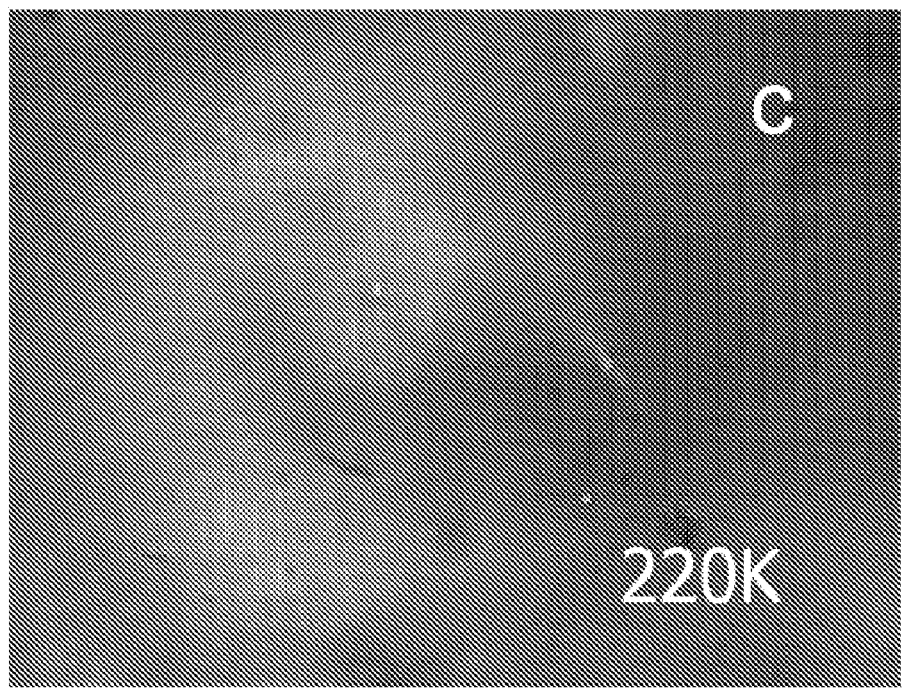
FIG. 11C is a MO image of the sample of FIG. 2A taken at 220K and at the same spatial orientation as the sample in FIG. 11A.
Figure 11D:
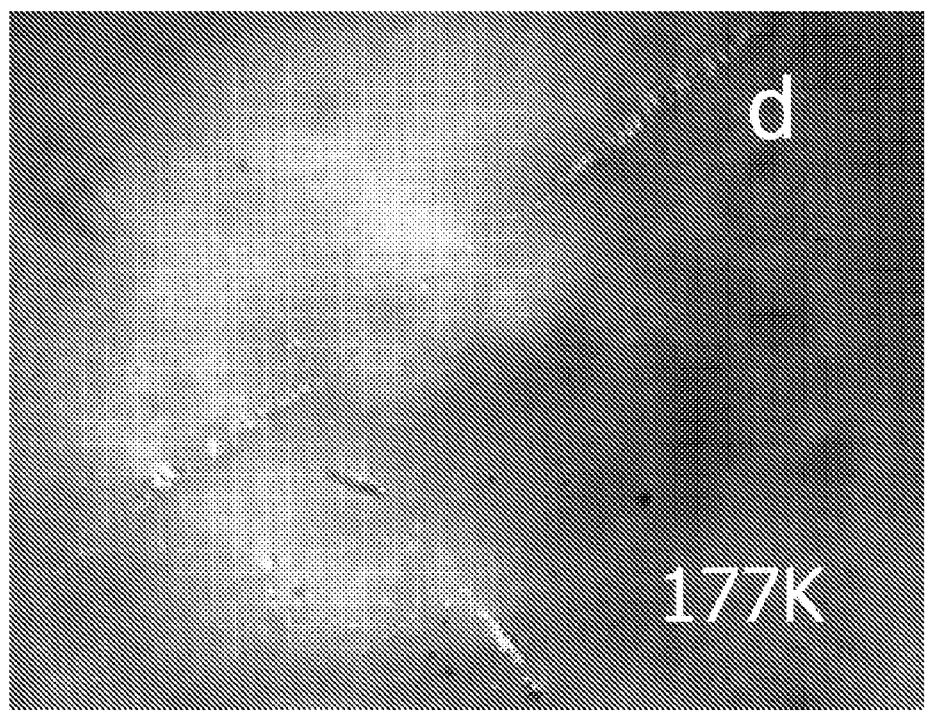
FIG. 11D is a MO image of the sample of FIG. 2A taken at 177K and at the same spatial orientation as the sample in FIG. 11A.
Figure 11E:
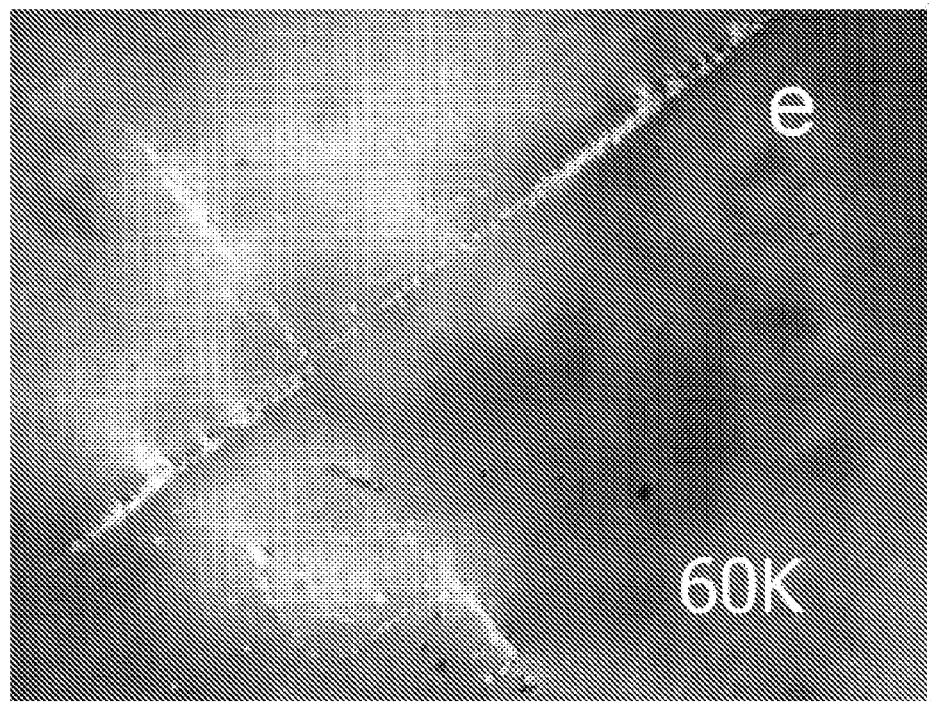
FIG. 11E is a MO image of the sample of FIG. 2A taken at 60K and at the same spatial orientation as the sample in FIG. 11A.

FIGS. 11B-11F show MO imagery of laser-processed sample 200 at 300K, 220K, 177K and 60 K, respectively with an external field of about 10 mTesla applied parallel to the c-axis. FIG. 11A shows a plain microscope image of the appearance of sample 200 at the same magnification as the other photos without the overlaid Faraday cell 1062. FIG. 11B is a MO image of sample 200 at 300K. As shown in FIG. 11B, there is no magnetic field visible. FIG. 11C is a MO image of sample 200 at 220K, which is the first temperature at which evidence of a dull localized magnetic flux was noticed in sample 200. In FIG. 11D, which is an MO image of sample 200 at 177K, localized magnetic flux begin forming along the grooves of sample 200, such as grooves 107a in FIG. 1. Also in FIG. 11D, a perimeter of laser processed region 209 of sample 200 is clearly visible in the bottom left quadrant of the image. As such, clear signatures of magnetic flux lines start to appear at 220 K as small illuminated bright spots. FIG. 11E is MO image of sample 200 at 60K. In FIG. 11E, the border of the laser processed region 209 is clearly visible. FIG. 11E also reveals that the path formed by magnetic field lines, as illustrated by the illuminated areas, mainly follows the grooves created in sample 200 by laser micromachining.

Figure 11F:
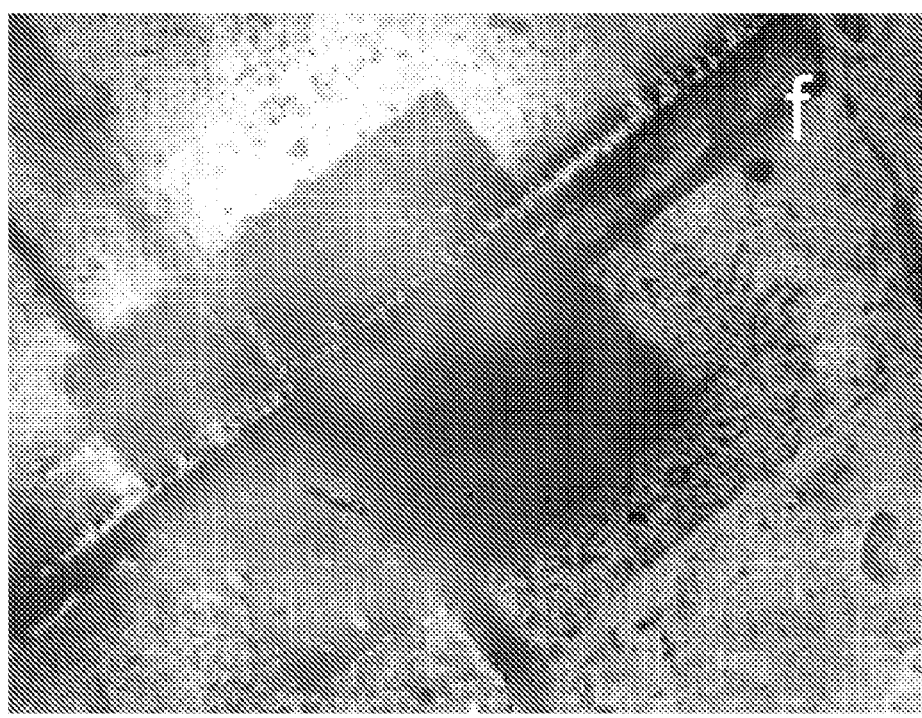
FIG. 11F is FIG. 11A with FIG. 11E overlaid thereon.

FIG. 11F shows FIGS. 11A and 11E superimposed showing where the MO images overlap the grooves and laser processed region 209 of sample 200. At cooling down the magnetic flux lines grow in intensity and in number indicating that magnetic field lines are accumulating in an inhomogeneous way in specific spots of sample 200. Some of the field lines align along the perimeter of the laser processed region 209. As shown in FIG. 11F, at 60K magnetic field lines are formed along the grooves in addition to the laser processed region 209.

One reason for the formation along the grooves may be due to the local roughness of the laser machined grooves. However, the bright spots cannot be merely artifacts caused by the surface roughness and mechanical stress of the laser machined grooves because of no similar bright spots appeared on MO imaging of glass substrates which have an altered surface condition (not shown).

The bright spots by the MO imaging could be attributed to diamagnetism or ferromagnetism. FIG. 12 plots intensity of MO images and temperature. Comparison of FIG. 12 with the magnetization SQUID data, such as FIG. 7A, shows that the MO images change near the temperatures where diamagnetism manifests itself in cooling, i.e., where the zero field cooled curve 743 changes slope. Hence the rough geometry of the grooves may represent diamagnetism as well as the laser processed region 209.

The synthesized material of the present invention may be a new very high-temperature superconductor. Oxygen doping, silver doping, or distortion of the crystalline lattice provided by the laser processing may play roles in the material exhibiting superconductive behavior. Since the critical temperature (i.e., transition temperature) is high, the coherence length is most likely very short, and there is no preclusion of pairing with orbital angular momentum greater than zero.

The MO imagery of the non-laser processed YBCO film, shown in FIGS. 10B and 10C shows that grooves contribute to the magnetic flux images below the transition temperature. The YBCO was a very thin film, while the surface area of the grooves of sample 200 includes 25 μm high double-walls. The depth of the laser processed top "crust" layer of sample 200 is about ten times more than that of the YBCO-film. In other words, the MO imaging was very likely detecting a superconducting phase of the laser processed region 209 of sample 200, which became detectable to the naked eye at about 220K, but which was likely detectable by other methods at an even higher temperature.

EXAMPLE 6

Figure 13A:
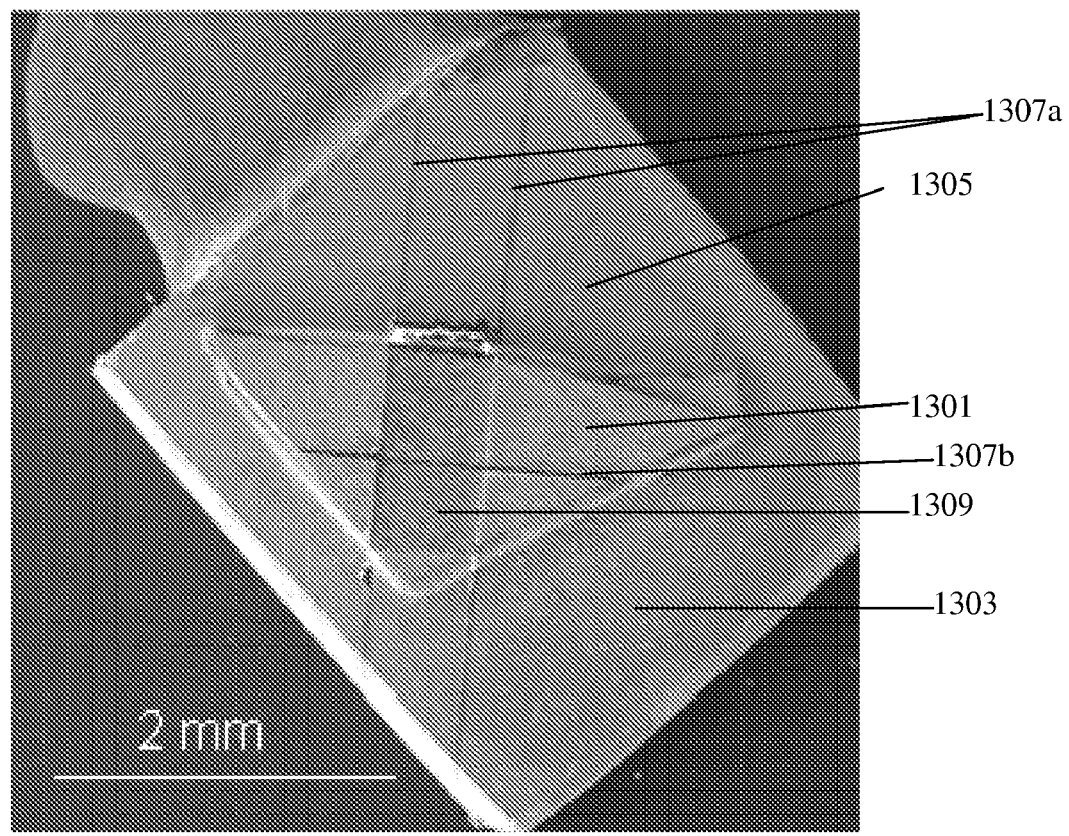
FIG. 13A is a scanning electron micrograph image of an alternative sample including the superconductive material of the present invention at a scale indicated by a line marked 2 millimeters on the figure.
Figure 13B:
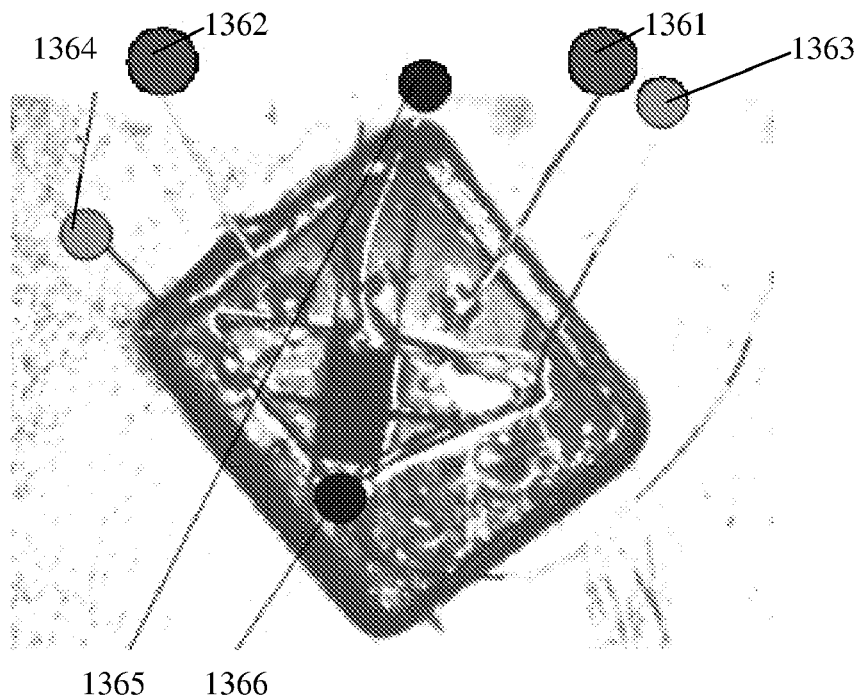
FIG. 13B is a scanning electron micrograph image of the sample of FIG. 13A illustrated the positioning of voltage and current leads.

FIG. 13A is an SEM of an alternative configuration of a sample 1300 having a laser processed region 1309 of the present invention. In this case, a triangular-shaped non-polished strontium ruthenate crystal plate 1301, having a thickness of about 100 microns is mechanically bonded on a substrate 1303. The same nichrome layer and silver layer 105 were deposited over the plate 1301 and substrate 1303 as discussed above with respect to FIG. 1. However, rather than laser machining grooves to form four conductive legs, as with legs 108 in FIG. 1, grooves 1307 are made in sample 1300 in the form a bar geometry, specifically two longer parallel grooves 1307a and one orthogonal bisecting groove 1307b. Sample 1300 also includes a laser processed region 1309 using the laser ablation technique discussed with respect to FIG. 1. The voltage and current connection for resistivity measurements are illustrated in FIG. 13B for two different voltage measurements. Leads 1361 and 1362 are for application of a current. Leads 1363 and 1364 are for longitudinal voltage measurements. Leads 1365 and 1367 are for transverse voltage measurements. This arrangement allows for the lateral and transverse voltage measurements to be taken simultaneously.

Figure 14A:
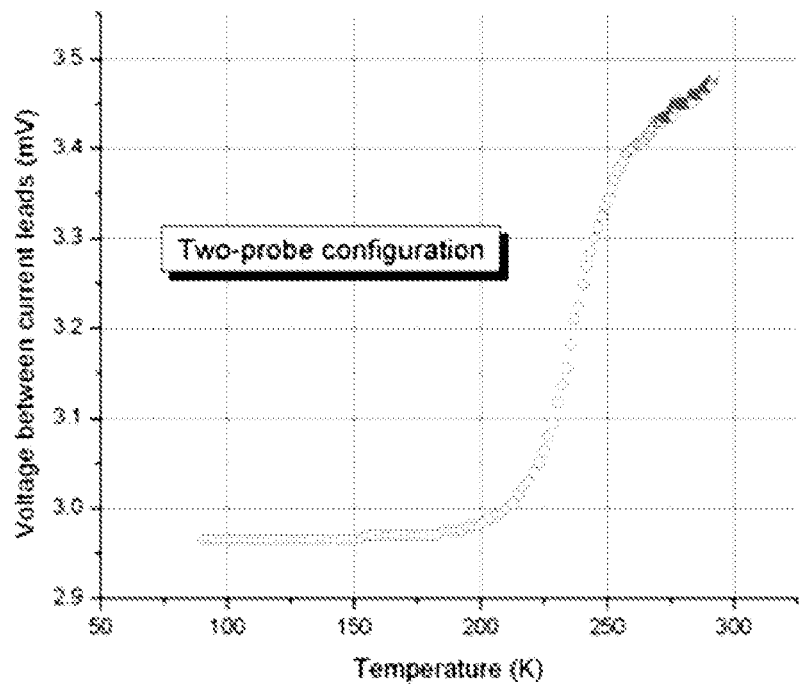
FIG. 14A is a plot of voltage vs. temperature for the sample of FIGS. 13A and 13B taken in a two probe configuration.
Figure 14B:
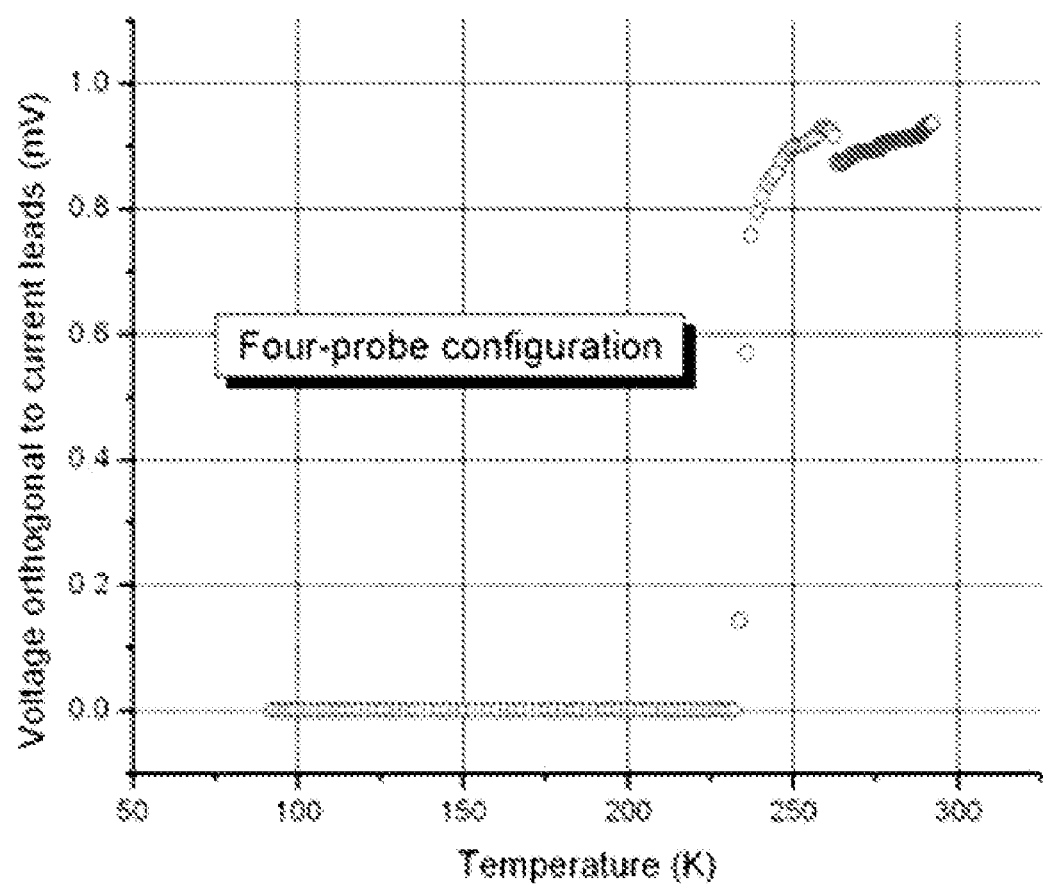
FIG. 14B is a plot of voltage vs. temperature for the sample of FIGS. 13A and 13B taken in a four probe configuration.

FIGS. 14A and 14B are plots of voltage versus temperature for sample 1300 for a two probe (lateral), FIG. 14A, and four probe (lateral and transverse), FIG. 14B configurations. Since voltage is equal to current times resistance and current was constant during the experiment, FIGS. 14A and 14B are also representative of resistance versus temperature. As such, sample 1300 also exhibits a transition at about 250K.

Some alternatives contemplated by the present invention include switching the deposited metallic layers from silver and/or nichrome to other metal or metals or excluding metal deposits completely. Another alternative is to reproduce the effective composition by methods that yield homogeneous samples, for example using the methods used on graphite to transform the material to diamond. The composition of overlying material and laser pulse characteristics may be varied to achieve a material of the present invention. Also the parent starting material may be other oxide metals which are capable of oxide enhancement via laser processing, preferably oxides in which it is difficult to enhance oxygen by application of non-equilibrium thermodynamic processes. In this case, the material of the present invention would be a laser processed metal oxide crystal in which the transition temperature of the material is higher than the transition temperature of the metal oxide crystal, including the presence of a transition temperature where the metal oxide crystal has no transition temperature.

While the invention has been particularly shown and described with reference to preferred embodiments thereof, it will be understood by those skilled in the art that they have been presented by way of example only, and not limitation, and various changes in form and details can be made therein without departing from the spirit and scope of the invention. Thus, the breadth and scope of the present invention should not be limited by any of the above-described exemplary embodiments, but should be defined only in accordance with the following claims and their equivalents. Additionally, all references cited herein, including issued U.S. patents, or any other references, are each entirely incorporated by reference herein, including all data, tables, figures, and text presented in the cited references. Also, it is to be understood that the phraseology or terminology herein is for the purpose of description and not of limitation, such that the terminology or phraseology of the present specification is to be interpreted by the skilled artisan in light of the teachings and guidance presented herein, in combination with the knowledge of one of ordinary skill in the art.

The foregoing description of the specific embodiments will so fully reveal the general nature of the invention that others can, by applying knowledge within the skill of the art (including the contents of the references cited herein), readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein.

What is claimed as new and desired to be protected by Letters Patent of the United States is:

1. A material exhibiting superconductivity characteristics, comprising:
    a laser processed region of a metal oxide crystal, wherein the processed region has a transition temperature that is greater than a transition temperature of the metal oxide crystal, wherein the processed region has a resistivity transition at a temperature between about 140K and 200K,
    wherein the metal oxide crystal is a strontium ruthenate crystal; and
    a layer of nichrome and a layer of silver over the strontium ruthenate crystal.

2. The material of claim 1, wherein the strontium ruthenate crystal has the general formula $Sr_{n+1}Ru_nO_{3n+1}$.

3. The material of claim 2, wherein nominal phase has n=1 and wherein the strontium ruthenate crystal includes phases where n=2 or 3.

4. A material exhibiting superconductivity characteristics, comprising:
    a laser processed region of a strontium ruthenate crystal, wherein the laser processed region of the strontium ruthenate crystal constitutes a material having a greater oxygen content than the strontium ruthenate crystal; and
    a layer of nichrome and a layer of silver over the strontium ruthenate crystal.

5. The material of claim 4, wherein the strontium ruthenate crystal has the general formula $Sr_2RuO_4$.

6. A material exhibiting superconductivity characteristics wherein the material is made by a process comprising:
    providing a metal oxide crystal;
    laser ablating at least a region of the metal oxide crystal wherein the metal oxide crystal is a strontium ruthenate crystal; and
    depositing a layer of nichrome and a layer of silver over the strontium ruthenate crystal.

* * * * *